(12) United States Patent
Chen et al.

(10) Patent No.: US 12,002,746 B2
(45) Date of Patent: Jun. 4, 2024

(54) CHIP PACKAGE STRUCTURE WITH METAL-CONTAINING LAYER

(71) Applicant: Taiwan Semiconductor Manufacturing Company, Ltd., Hsinchu (TW)

(72) Inventors: Yu-Huan Chen, Taoyuan (TW); Kuo-Ching Hsu, New Taipei (TW); Chen-Shien Chen, Zhubei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/744,884

(22) Filed: May 16, 2022

(65) Prior Publication Data
US 2022/0270963 A1    Aug. 25, 2022

Related U.S. Application Data

(62) Division of application No. 16/893,467, filed on Jun. 5, 2020, now Pat. No. 11,335,634.

(60) Provisional application No. 62/893,874, filed on Aug. 30, 2019.

(51) Int. Cl.
  *H01L 23/498* (2006.01)
  *H01L 21/48* (2006.01)
  *H01L 23/00* (2006.01)

(52) U.S. Cl.
  CPC .... *H01L 23/49866* (2013.01); *H01L 21/4846* (2013.01); *H01L 24/16* (2013.01); *H01L 24/81* (2013.01); *H01L 2224/16145* (2013.01); *H01L 2224/81911* (2013.01); *H01L 2224/81912* (2013.01)

(58) Field of Classification Search
  None
  See application file for complete search history.

(56) References Cited

U.S. PATENT DOCUMENTS

| 6,940,169 | B2 | 9/2005 | Jin et al. |
| 10,128,195 | B2 | 11/2018 | Lin et al. |
| 10,446,478 | B2 | 10/2019 | Jeong et al. |
| 2011/0254156 | A1 | 10/2011 | Lin |
| 2013/0087920 | A1* | 4/2013 | Jeng ................ H01L 23/49827 257/773 |
| 2017/0005035 | A1 | 1/2017 | Chen et al. |

FOREIGN PATENT DOCUMENTS

| TW | 201717343 A | 5/2017 |
| TW | 201919179 A | 5/2019 |

* cited by examiner

*Primary Examiner* — Hung K Vu
(74) *Attorney, Agent, or Firm* — McClure, Qualey & Rodack, LLP

(57) ABSTRACT

A chip package structure is provided. The chip package structure includes a first wiring substrate including a substrate, a first pad, a second pad, and an insulating layer. The chip package structure includes a nickel-containing layer over the first pad. The chip package structure includes a conductive protection layer over the nickel-containing layer. The conductive protection layer includes tin, and a recess is surrounded by the conductive protection layer and the insulating layer over the first pad. The chip package structure includes a chip over the second surface of the substrate. The chip package structure includes a conductive bump between the second pad and the chip.

20 Claims, 30 Drawing Sheets

CHIP PACKAGE STRUCTURE WITH METAL-CONTAINING LAYER

PRIORITY CLAIM AND CROSS-REFERENCE

This application is a Divisional of U.S. application Ser. No. 16/893,467, filed on Jun. 5, 2020 (now U.S. Pat. No. 11,335,634, issued on May 17, 2022), which claims the benefit of U.S. Provisional Application No. 62/893,874, filed on Aug. 30, 2019, and entitled "CHIP PACKAGE STRUCTURE AND METHOD FOR FORMING THE SAME", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits are typically manufactured on a semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1M are cross-sectional views of various stages of a process for forming a chip package structure, in accordance with some embodiments.

DETAILED DESCRIPTION

Figure 1A:
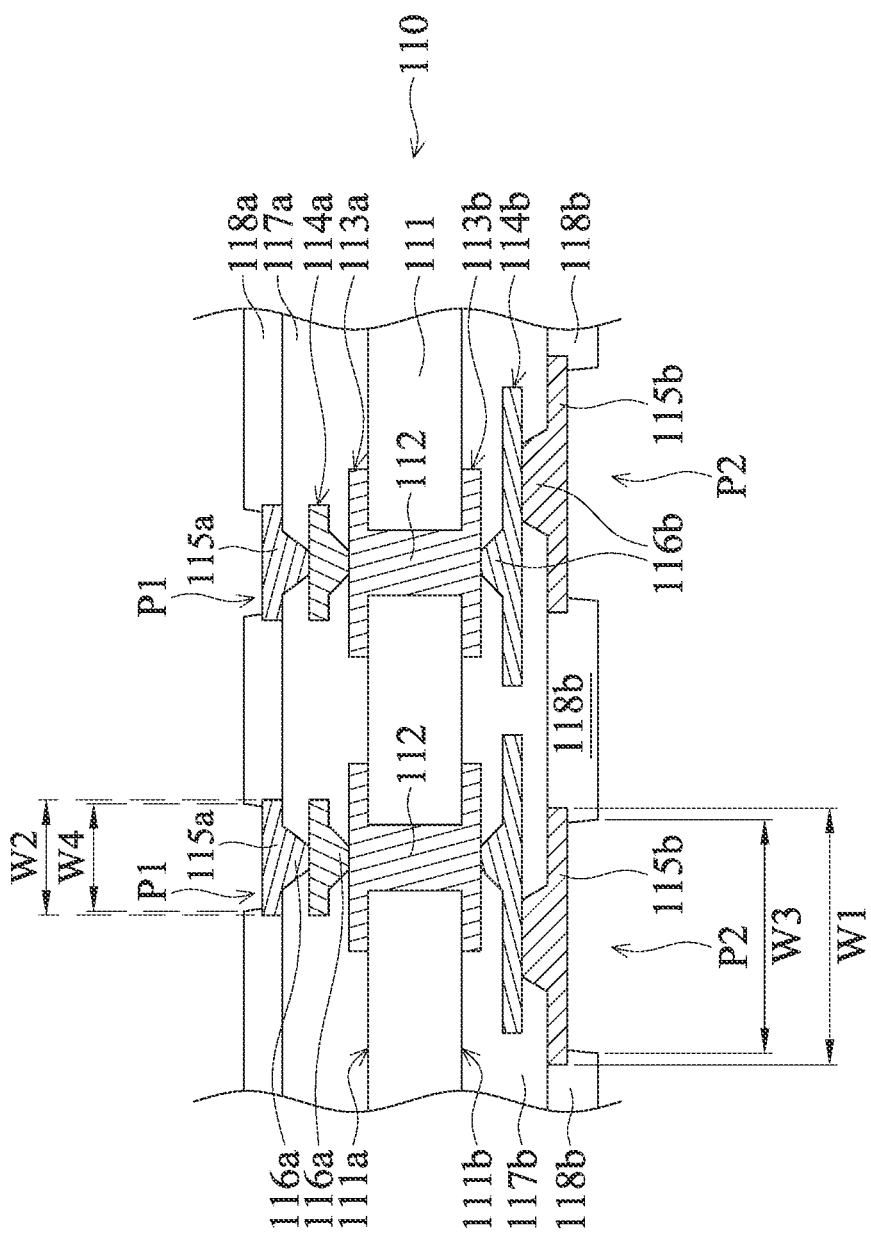

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1M are cross-sectional views of various stages of a process for forming a chip package structure, in accordance with some embodiments. As shown in FIG. 1A, a wiring substrate 110 is provided, in accordance with some embodiments. The wiring substrate 110 includes a substrate 111, through substrate vias (or plated through holes, PTH) 112, wiring layers 113a, 113b, 114a and 114b, pads 115a and 115b, conductive vias 116a and 116b, and insulating layers 117a, 117b, 118a and 118b, in accordance with some embodiments.

The substrate 111 has surfaces 111a and 111b, in accordance with some embodiments. The surface 111a is opposite to the surface 111b, in accordance with some embodiments. In some embodiments, the substrate 111 is made of an insulating material such as a fiber material, a polymer material, or a glass material. The fiber material includes, for example, a glass fiber material.

In some other embodiments, the substrate 111 is made of a semiconductor material or a conductive material, in accordance with some embodiments. The semiconductor material includes, for example, silicon or germanium. The conductive material includes, for example, a metal material.

The through substrate vias 112 pass through the substrate 111, in accordance with some embodiments. The wiring layers 113a and 113b are formed over the surfaces 111a and 111b respectively, in accordance with some embodiments. The through substrate vias 112 electrically connect the wiring layer 113a to the wiring layer 113b, in accordance with some embodiments.

If the substrate 111 is made of a semiconductor material or a conductive material, an insulating layer (not shown) is formed between the substrate 111 and the through substrate vias 112 and between the substrate 111 and the wiring layers 113a and 113b to electrically insulate the substrate 111 from the through substrate vias 112 and the wiring layers 113a and 113b, in accordance with some embodiments.

The wiring layer 114a, the pads 115a, the conductive vias 116a, and the insulating layers 117a and 118a are formed over the surface 111a, in accordance with some embodiments. The wiring layer 114a and the conductive vias 116a are in the insulating layer 117a, in accordance with some embodiments. The pads 115a are over the insulating layer 117a, in accordance with some embodiments. The conductive vias 116a are electrically connected between the wiring layers 113a and 114a and between the wiring layer 114a and the pads 115a, in accordance with some embodiments.

The insulating layer 118a is formed over the insulating layer 117a and the pads 115a, in accordance with some embodiments. The insulating layer 118a has openings P1, in accordance with some embodiments. The openings P1 respectively expose the pads 115a thereunder, in accordance with some embodiments. The insulating layer 118a partially covers the pads 115a, in accordance with some embodiments.

The wiring layer 114b, the pads 115b, the conductive vias 116b, and the insulating layers 117b and 118b are formed over the surface 111b, in accordance with some embodiments. The wiring layer 114b and the conductive vias 116b are in the insulating layer 117b, in accordance with some embodiments. The pads 115b are over the insulating layer 117b, in accordance with some embodiments. The conductive vias 116b are electrically connected between the wiring layers 113b and 114b and between the wiring layer 114b and the pads 115b, in accordance with some embodiments.

The insulating layer 118b is formed over the insulating layer 117b and the pads 115b, in accordance with some embodiments. The insulating layer 118b has openings P2, in accordance with some embodiments. The openings P2 respectively expose the pads 115b, in accordance with some embodiments. The insulating layer 118b partially covers the pads 115b, in accordance with some embodiments.

In some embodiments, the pad 115b is wider than the pad 115a. That is, a width W1 of the pad 115b is greater than a width W2 of the pad 115a, in accordance with some embodiments. The pad 115b is used to bond with a wiring substrate (e.g., a printed circuit board), in accordance with some embodiments. The pad 115a is used to bond with a chip, in accordance with some embodiments. The width W1 ranges from about 200 µm to about 600 µm, in accordance with some embodiments. The width W2 ranges from about 20 µm to about 110 µm, in accordance with some embodiments. In some embodiments, a (maximum) width W3 of the opening P2 is greater than a (maximum) width W4 of the opening P1.

The through substrate vias 112, the wiring layers 113a, 113b, 114a and 114b, the pads 115a and 115b, and the conductive vias 116a and 116b are made of a conductive material such as a metal material or an alloy thereof, in accordance with some embodiments. The metal material includes aluminum, copper or tungsten.

Figure 1B:
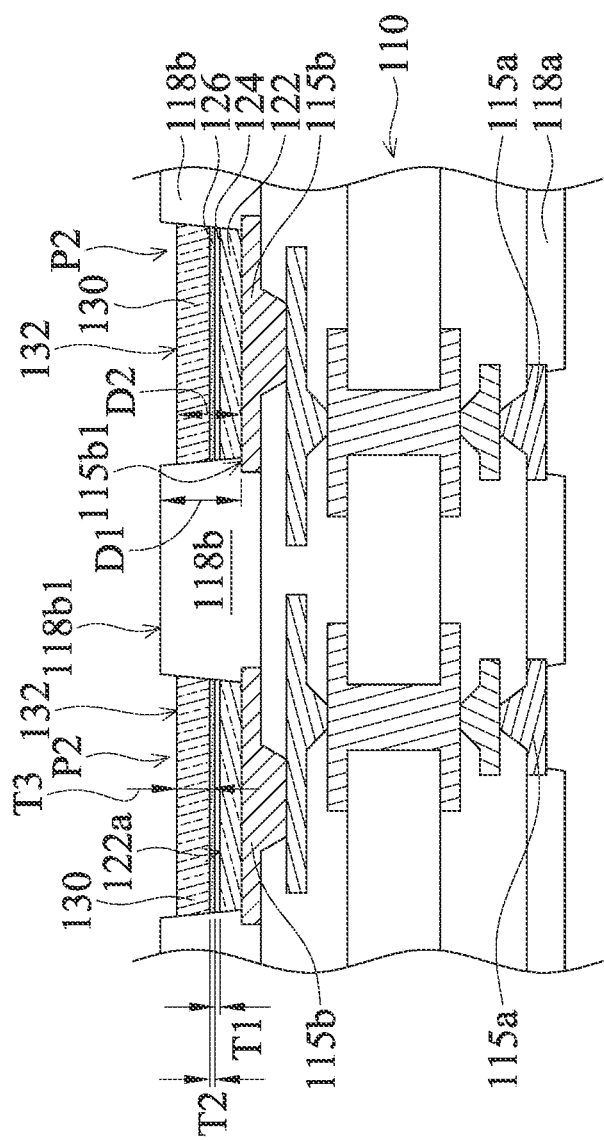

As shown in FIG. 1B, a nickel-containing layer 122 is formed over top surfaces 115b1 of the pads 115b, in accordance with some embodiments. The nickel-containing layer 122 covers the entire exposed portion of the top surface 115b1, which is exposed by the opening P2, in accordance with some embodiments. The nickel-containing layer 122 is in the openings P2, in accordance with some embodiments.

The nickel-containing layer 122 is made of nickel or alloys thereof, in accordance with some embodiments. The nickel-containing layer 122 is formed using a plating process such as an electroless plating process, in accordance with some embodiments.

As shown in FIG. 1B, a palladium-containing layer 124 is formed over the nickel-containing layer 122, in accordance with some embodiments. The palladium-containing layer 124 is in the openings P2, in accordance with some embodiments. The palladium-containing layer 124 has a thickness T1 ranging from about 0.02 µm to about 0.1 µm, in accordance with some embodiments. The palladium-containing layer 124 is made of palladium or alloys thereof, in accordance with some embodiments. The palladium-containing layer 124 is formed using a plating process such as an electroless plating process, in accordance with some embodiments.

As shown in FIG. 1B, a gold-containing layer 126 is formed over the palladium-containing layer 124, in accordance with some embodiments. The gold-containing layer 126 is in the openings P2, in accordance with some embodiments. The gold-containing layer 126 has a thickness T2 ranging from about 0.02 µm to about 0.1 µm, in accordance with some embodiments. The gold-containing layer 126 is made of gold or alloys thereof, in accordance with some embodiments. The gold-containing layer 126 is formed using a plating process such as an immersion plating process, in accordance with some embodiments.

As shown in FIG. 1B, a conductive protection layer 130 is formed over the gold-containing layer 126, in accordance with some embodiments. In some embodiments, a porosity of the conductive protection layer 130 is lower than a porosity of the palladium-containing layer 124 and lower than a porosity of the gold-containing layer 126. That is, the conductive protection layer 130 has a structure, which is denser than that of the palladium-containing layer 124 and the gold-containing layer 126, in accordance with some embodiments.

In some embodiments, a thickness T3 of the conductive protection layer 130 is greater than a sum of the thickness T1 of the palladium-containing layer 124 and the thickness T2 of the gold-containing layer 126. In some embodiments, the conductive protection layer 130 is thinner than the insulating layer 118b over the pads 115b.

The thickness T3 ranges from about 1 µm to about 25 µm, in accordance with some embodiments. The thickness T3 ranges from about 1 µm to about 10 µm, in accordance with some embodiments. The conductive protection layer 130 covers an entire top surface 122a of the nickel-containing layer 122, in accordance with some embodiments.

If the conductive protection layer 130 is not formed, the nickel atoms in the nickel-containing layer 122 may be affected by deflux solutions used in subsequent deflux processes, and may tend to migrate through the palladium-containing layer 124 and the gold-containing layer 126 and to be oxidized. Since the conductive protection layer 130 is denser and thicker than the palladium-containing layer 124 and the gold-containing layer 126, the conductive protection layer 130 may separate the nickel-containing layer 122 from the deflux solutions. Therefore, the conductive protection layer 130 may improve the adhesion between the pads 115b and conductive bumps, which are subsequently formed between, and connected between, the pads 115b and a chip. The formation of the conductive protection layer 130 may strengthen the conductive bumps.

Since the conductive protection layer 130 may provide a stronger protection to the nickel-containing layer 122, the deflux solution having stronger removal ability for flux layers may be used to remove the flux layers more completely. Therefore, the yield of the removal process of the flux layers may be improved.

In some embodiments, a distance D1 between a top surface 118b1 of the insulating layer 118b and a top surface 115b1 of the pad 115b is greater than a distance D2 between a top surface 132 of the conductive protection layer 130 and the top surface 115b1 of the pad 115b. That is, the top surface 132 is lower than the top surface 118b1, in accordance with some embodiments.

The conductive protection layer 130, the gold-containing layer 126, the palladium-containing layer 124, and the nickel-containing layer 122 are made of different materials, in accordance with some embodiments. The conductive protection layer 130 is made of a metal material (e.g., tin) or an alloy thereof (e.g., tin alloy), in accordance with some embodiments. The conductive protection layer 130 is formed using a printing process or an electroless plating process, in accordance with some embodiments.

Figure 1C:
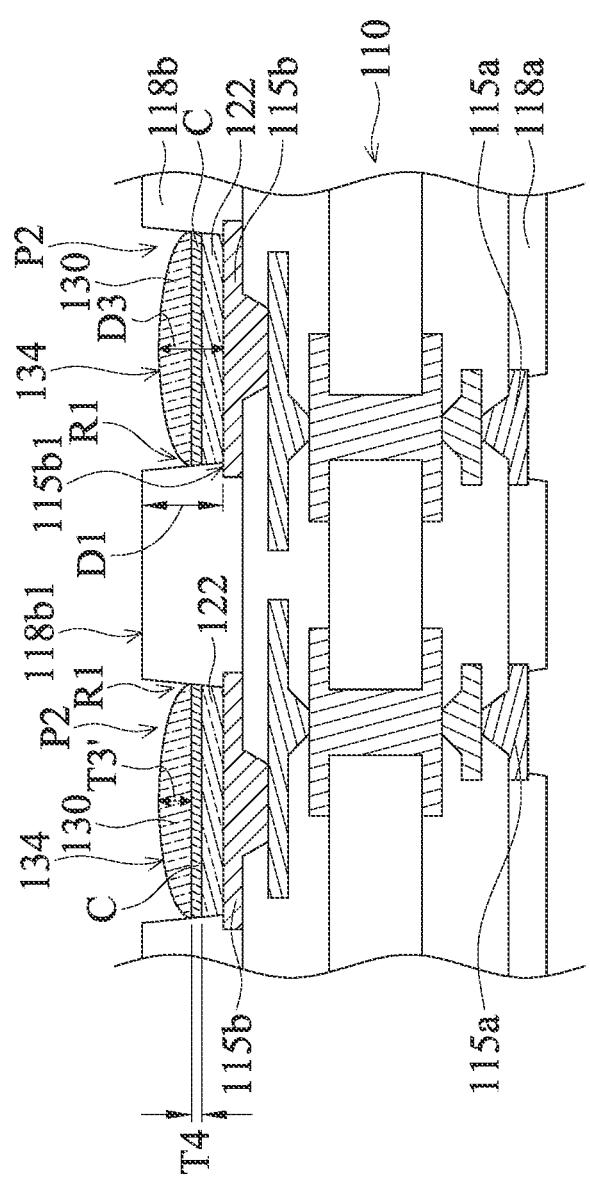

As shown in FIG. 1C, a reflow process is performed over the conductive protection layer 130, in accordance with some embodiments. During the reflow process, the gold-containing layer 126 and the palladium-containing layer 124 are dissolved in the conductive protection layer 130, and an intermetallic compound layer C is formed between the conductive protection layer 130 and the nickel-containing layer 122, in accordance with some embodiments. The intermetallic compound layer C may improve the adhesion between the conductive protection layer 130 and the nickel-containing layer 122.

The intermetallic compound layer C is structurally denser than the conductive protection layer 130, the gold-containing layer 126, and the palladium-containing layer 124, in accordance with some embodiments. In some embodiments, a thickness T4 of the intermetallic compound layer C is greater than the sum of the thickness T1 of the palladium-containing layer 124 and the thickness T2 of the gold-containing layer 126 (as shown in FIG. 1B). Therefore, the intermetallic compound layer C provides a greater protection to the nickel-containing layer 122 than the palladium-containing layer 124 and the gold-containing layer 126, in accordance with some embodiments. As a result, the intermetallic compound layer C and the conductive protection layer 130 may together protect the nickel-containing layer 122 from damage during subsequent processes.

The intermetallic compound layer C is made of materials of the conductive protection layer 130 and the nickel-containing layer 122, in accordance with some embodiments. The intermetallic compound layer C includes a compound material, in accordance with some embodiments. The compound material includes, for example, tin and nickel, such as $Ni_3Sn_4$.

After the reflow process, the conductive protection layer 130 has a (maximum) thickness T3', in accordance with some embodiments. The thickness T3' is greater than the sum of the thickness T1 of the palladium-containing layer 124 and the thickness T2 of the gold-containing layer 126 (as shown in FIG. 1B), in accordance with some embodiments. The thickness T3' is greater than the thickness T3 (as shown in FIG. 1B), in accordance with some embodiments.

The thickness T3' ranges from about 1 μm to about 25 μm, in accordance with some embodiments. The thickness T3' ranges from about 1 μm to about 10 μm, in accordance with some embodiments. In some embodiments, the (reflowed) conductive protection layer 130 is thinner than the insulating layer 118b over the pads 115b.

The conductive protection layer 130 has a curved top surface 134, in accordance with some embodiments. In some embodiments, the distance D1 between the top surface 118b1 of the insulating layer 118b and the top surface 115b1 of the pad 115b is greater than a (maximum) distance D3 between the curved top surface 134 and the top surface 115b1.

In some embodiments, a recess R1 is surrounded by the conductive protection layer 130 and the insulating layer 118b over the pads 115b. The entire conductive protection layer 130 over one of the pads 115b is in the corresponding opening P2, in accordance with some embodiments. That is, the conductive protection layer 130 does not extend out of the corresponding opening P2, which prevents the conductive protection layer 130 from contacting carrier substrates in subsequent processes, in accordance with some embodiments.

The designs for the purpose of preventing the conductive protection layer 130 from contacting carrier substrates in subsequent processes include that the conductive protection layer 130 is thinner than the insulating layer 118b over the pads 115b (as shown in FIG. 1B), the top surface 132 is lower than the top surface 118b1 (as shown in FIG. 1B), and the distance D1 between the top surface 118b1 of the insulating layer 118b and the top surface 115b1 of the pad 115b is greater than a (maximum) distance D3 between the curved top surface 134 and the top surface 115b1 (as shown in FIG. 1C). In some other embodiments (not shown), the curved top surface 134 (or the top surface 132) is higher than the top surface 118b1 according to design requirements.

Figure 1D:
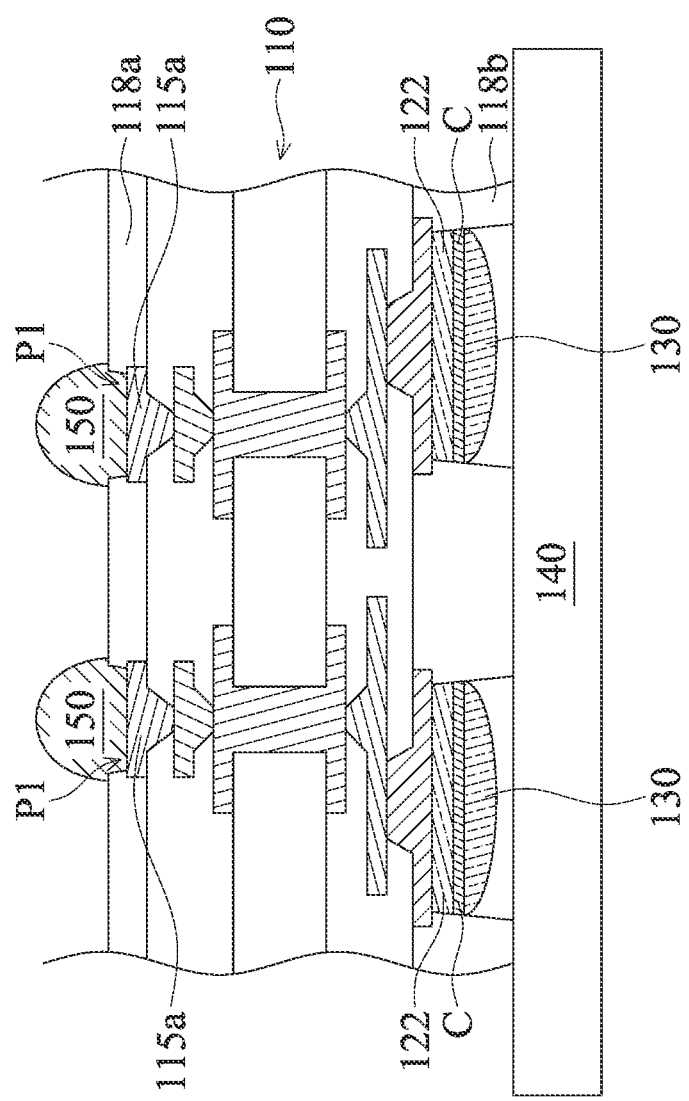

As shown in FIG. 1D, the wiring substrate 110 is flipped upside down and is disposed over a carrier substrate 140, in accordance with some embodiments. The carrier substrate 140 is configured to provide temporary mechanical and structural support during subsequent processing steps, in accordance with some embodiments. The carrier substrate 140 includes glass, silicon oxide, aluminum oxide, metal, a combination thereof, or the like, in accordance with some embodiments. The carrier substrate 140 includes a metal frame, in accordance with some embodiments.

As shown in FIG. 1D, a conductive layer 150 is formed over the pads 115a, in accordance with some embodiments. The conductive layer 150 includes solder balls, in accordance with some embodiments. The conductive layer 150 is made of a conductive material, such as metal (e.g., tin) or alloys thereof (e.g., tin alloy), in accordance with some embodiments. The formation of the conductive layer 150 includes forming a solder material layer (not shown) over the pads 115a; and reflowing the solder material layer to form the conductive layer 150, in accordance with some embodiments.

Figure 1E:
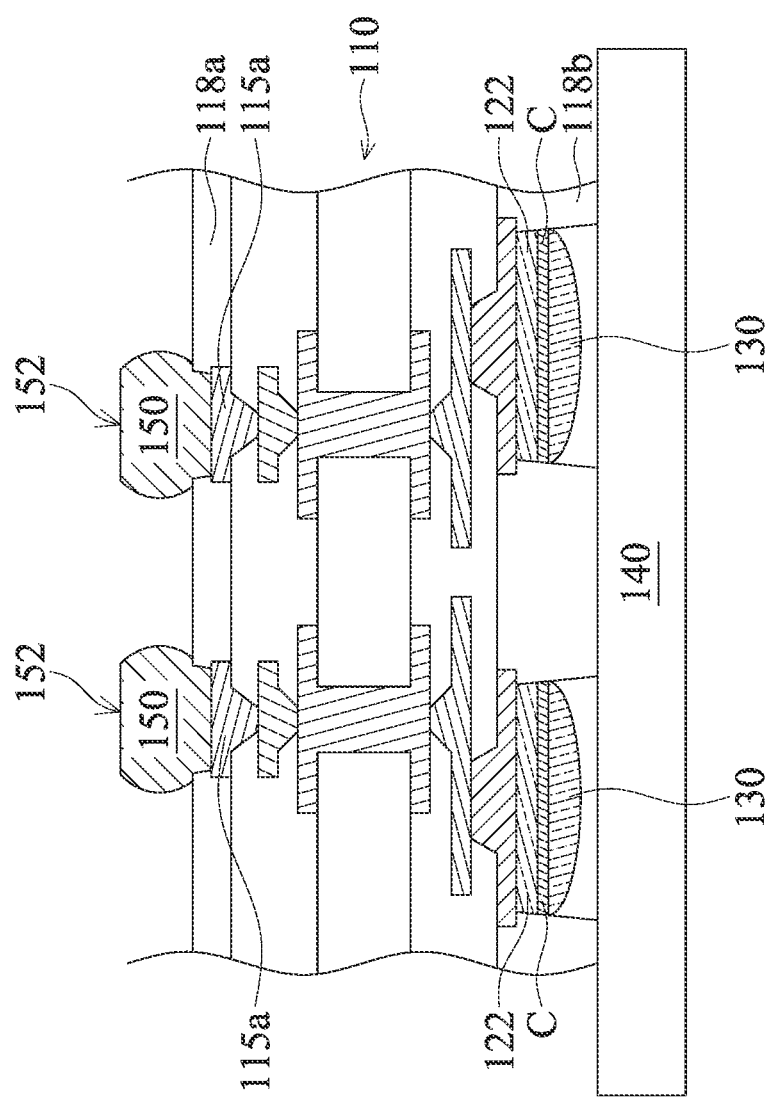
Figure 1F:
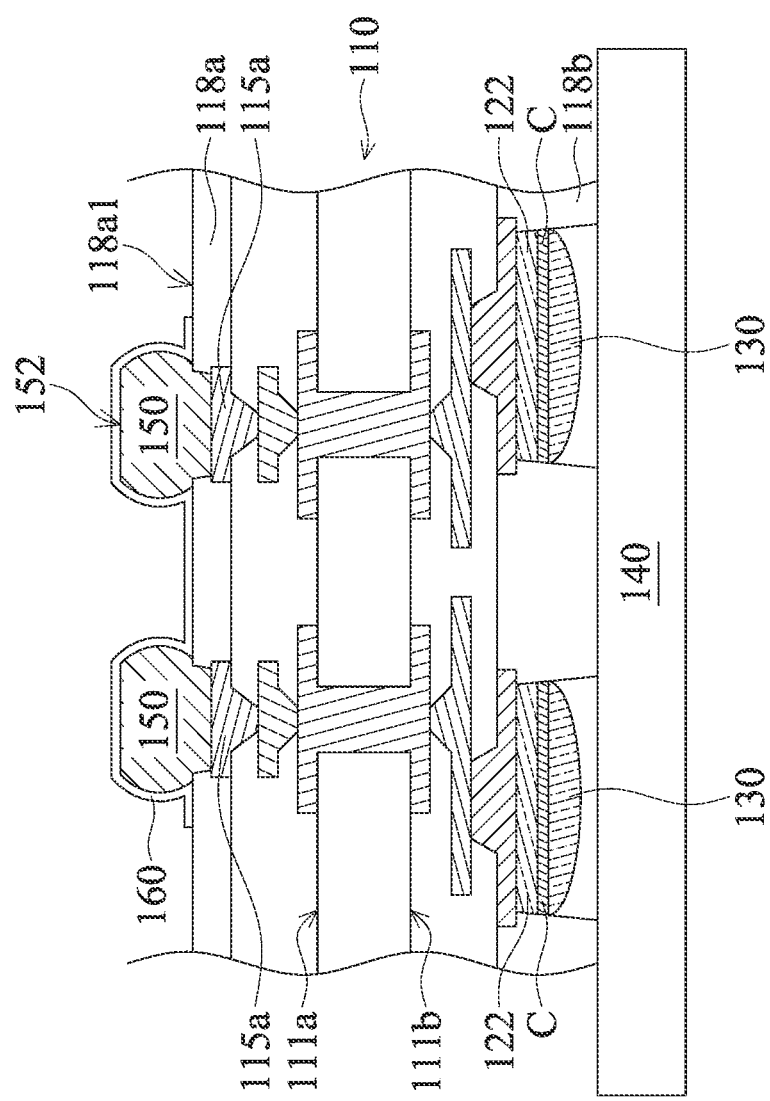

As shown in FIG. 1E, a thermo-compression process is performed over the conductive layer 150 to flatten a top surface 152 of the conductive layer 150, in accordance with some embodiments. As shown in FIG. 1F, a flux material layer 160 is formed over the conductive layer 150 and a top surface 118a1 of the insulating layer 118a, in accordance with some embodiments. The flux material layer 160 is used to secure the bonding between the conductive layer 150 and conductive bumps over a chip in a subsequent chip bonding process so as to increase the yield of the chip bonding process.

In some embodiments, the flux material layer 160 includes tartaric acid, a resin, an amine, and/or a solvent. In some embodiments, the amine is an alkyl substituted amine, an ethanol amine, an ethoxylated amine, or a propoxylated amine. In some embodiments, a surfactant is used, sometimes referred to as a flow modifier. The specific surfactant depends upon compatibility with the flux material layer 160. In some embodiments, the surfactant is anionic such as long chain alkyl carboxylic acids, such as lauric acids, steric acids, or the like. The flux material layer 160 is formed using a dipping process or a jetting process, in accordance with some embodiments.

Figure 1G:
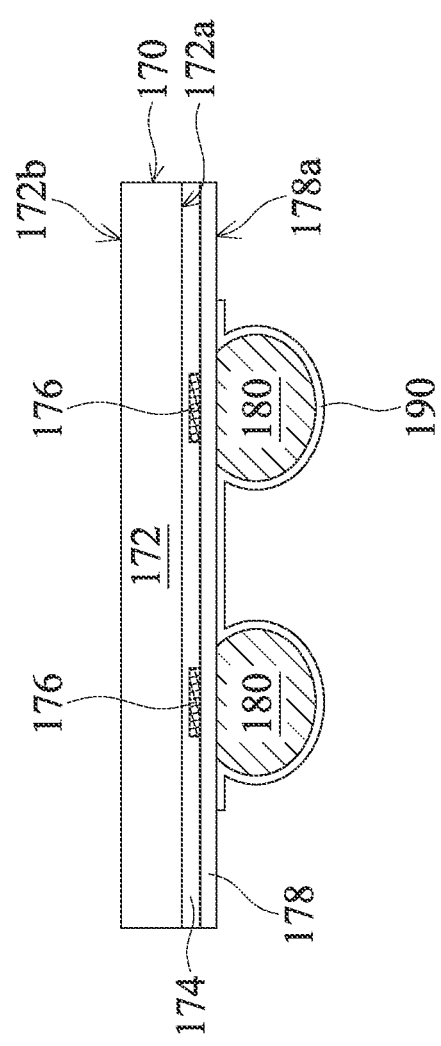

As shown in FIG. 1G, a chip 170 is provided, in accordance with some embodiments. The chip 170 includes a semiconductor substrate 172, a dielectric layer 174, conductive pads 176, and an interconnection layer 178, in accordance with some embodiments.

The semiconductor substrate 172 has a front surface 172a and a back surface 172b opposite to the front surface 172a, in accordance with some embodiments. In some embodiments, active elements (e.g. transistors, diodes, or the like) and/or passive elements (e.g. resistors, capacitors, inductors, or the like) are formed over the front surface 172a or in the semiconductor substrate 172 adjacent to the front surface 172a.

In some embodiments, the semiconductor substrate 172 is made of at least an elementary semiconductor material including silicon or germanium in a single crystal, polycrystal, or amorphous structure. In some other embodiments, the semiconductor substrate 172 is made of a compound semiconductor, such as silicon carbide, gallium arsenide, gallium phosphide, indium phosphide, indium arsenide, an alloy semiconductor, such as SiGe, or GaAsP, or a combination thereof. The semiconductor substrate 172 may also include multi-layer semiconductors, semiconductor on insulator (SOI) (such as silicon on insulator or germanium on insulator), or a combination thereof.

The dielectric layer 174 is formed over the front surface 172a, in accordance with some embodiments. The dielectric layer 174 is made of a polymer material, such as a polybenzoxazole (PBO) layer, a polyimide layer, a benzocyclobutene (BCB) layer, an epoxy layer, a photo-sensitive material layer, or another suitable material.

The conductive pads 176 are formed in the dielectric layer 174, in accordance with some embodiments. The conductive pads 176 are electrically connected to devices (not shown) formed in/over the semiconductor substrate 172, in accordance with some embodiments. The conductive pads 176 are made of a conductive material, such as copper (Cu), copper alloy, aluminum (Al), aluminum alloy, tungsten (W), tungsten alloy, titanium (Ti), titanium alloy, tantalum (Ta) or tantalum alloy, in accordance with some embodiments.

The interconnection layer 178 is formed over the dielectric layer 174, in accordance with some embodiments. The interconnection layer 178 includes dielectric layers (not shown) and conductive interconnection structures (not shown) in the dielectric layers, in accordance with some embodiments.

As shown in FIG. 1G, conductive bumps 180 are formed over the interconnection layer 178, in accordance with some embodiments. The conductive interconnection structures of the interconnection layer 178 are electrically connected to the conductive bumps 180 and the conductive pads 176, in accordance with some embodiments.

The conductive bumps 180 are made of a conductive material, such as tin (Sn) or alloys thereof, in accordance with some embodiments. In some other embodiments, the conductive bumps 180 are made of copper (Cu), copper alloy, aluminum (Al), aluminum alloy, tungsten (W), tungsten alloy, titanium (Ti), titanium alloy, tantalum (Ta) or tantalum alloy.

As shown in FIG. 1G, a flux material layer 190 is formed over the conductive bumps 180 and a surface 178a of the interconnection layer 178, in accordance with some embodiments. The flux material layer 190 is used to secure the bond between the conductive bumps 180 and the conductive layer 150 (as shown in FIG. 1F) in a subsequent chip bonding process so as to increase the yield of the chip bonding process, in accordance with some embodiments.

In some embodiments, the flux material layer 190 includes tartaric acid, a resin, an amine, and/or a solvent. In some embodiments, the amine is an alkyl substituted amine, an ethanol amine, an ethoxylated amine, or a propoxylated amine. In some embodiments, a surfactant is used, sometimes referred to as a flow modifier. The specific surfactant depends upon compatibility with the flux material layer 190. In some embodiments, the surfactant is anionic such as long chain alkyl carboxylic acids, such as lauric acids, steric acids, or the like. The flux material layer 190 is formed using a dipping process or a jetting process, in accordance with some embodiments.

Figure 1H:
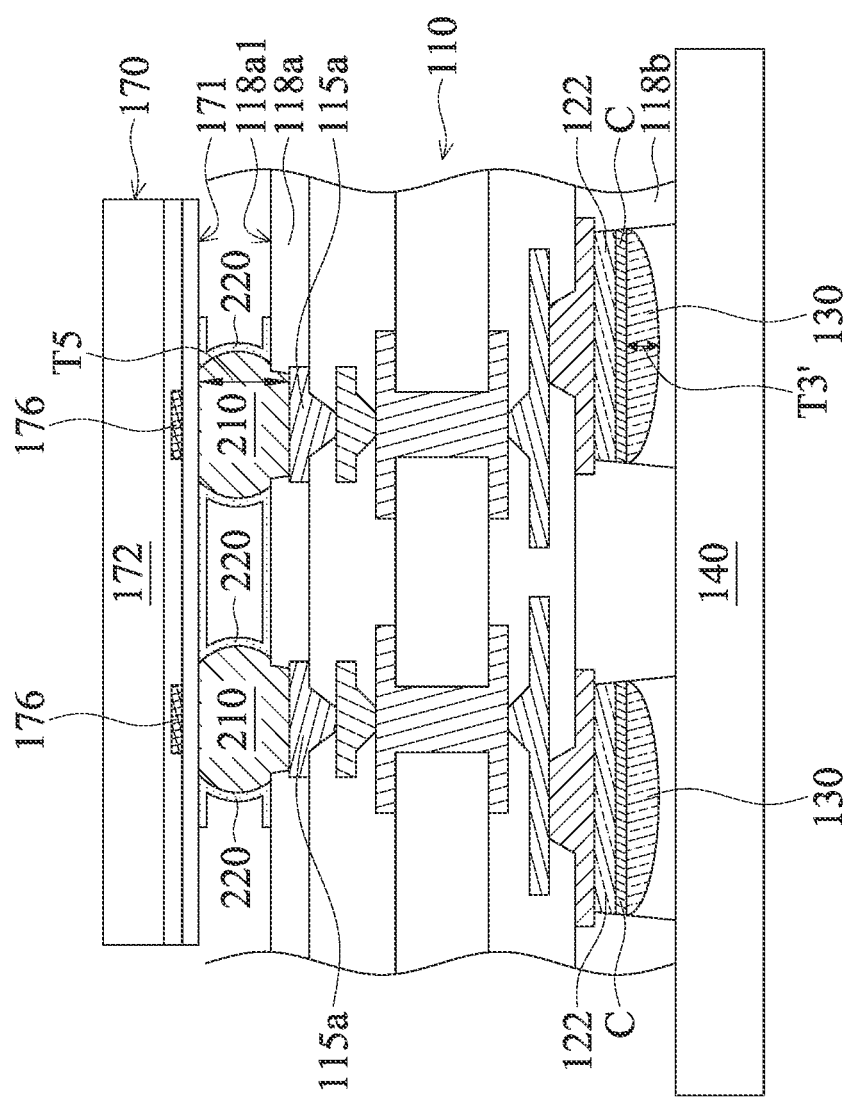
Figure 11:
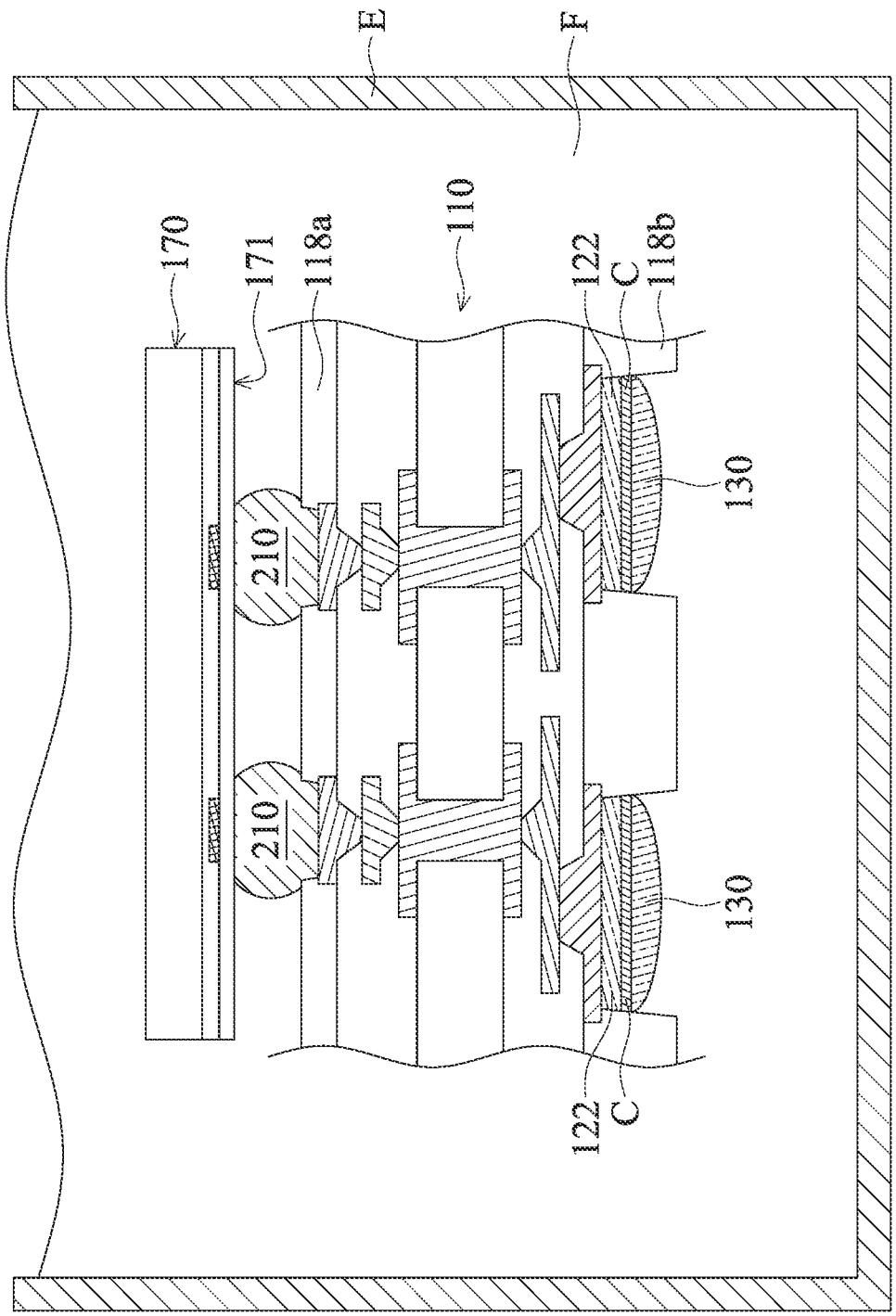

As shown in FIG. 1H, the chip 170 is bonded to the wiring substrate 110 through conductive bumps 210 and a flux layer 220, in accordance with some embodiments. The flux layer 220 surrounds the conductive bumps 210, in accordance with some embodiments.

The conductive bumps 210 are between, and connected to, the pads 115a and the chip 170, in accordance with some embodiments. The conductive bumps 210 are formed from the conductive layer 150 and the conductive bumps 180, in accordance with some embodiments. The flux layer 220 is formed from the flux material layers 160 and 190, in accordance with some embodiments.

The conductive protection layer 130 is thinner than the conductive bump 210, in accordance with some embodiments. That is, the (maximum) thickness T3' of the conductive protection layer 130 is less than a thickness T5 of the conductive bump 210, in accordance with some embodiments.

As shown in FIG. 1I, the flux layer 220 is removed, in accordance with some embodiments. The removal process of the flux layer 220 includes a dipping process or a jetting process, in accordance with some embodiments. For example, in the dipping process, the wiring substrate 110 is dipped in a deflux solution F accommodated in a tank E, in accordance with some embodiments. The flux layer 220 may dissolve in the deflux solution F, in accordance with some embodiments.

The conductive protection layer 130 and the intermetallic compound layer C separate the nickel-containing layer 122 from the deflux solution F, in accordance with some embodiments. The conductive protection layer 130 is in direct contact with the deflux solution F, in accordance with some embodiments.

The deflux solution F includes aqueous liquids (e.g., deionized water) and solvents such as hydrofluorocarbons (HFC's), hydrochlorofluorocarbons (HCFC's), chlorofluorocarbons, alcohols, terpenes, and combinations thereof, in accordance with some embodiments.

Figure 1J:
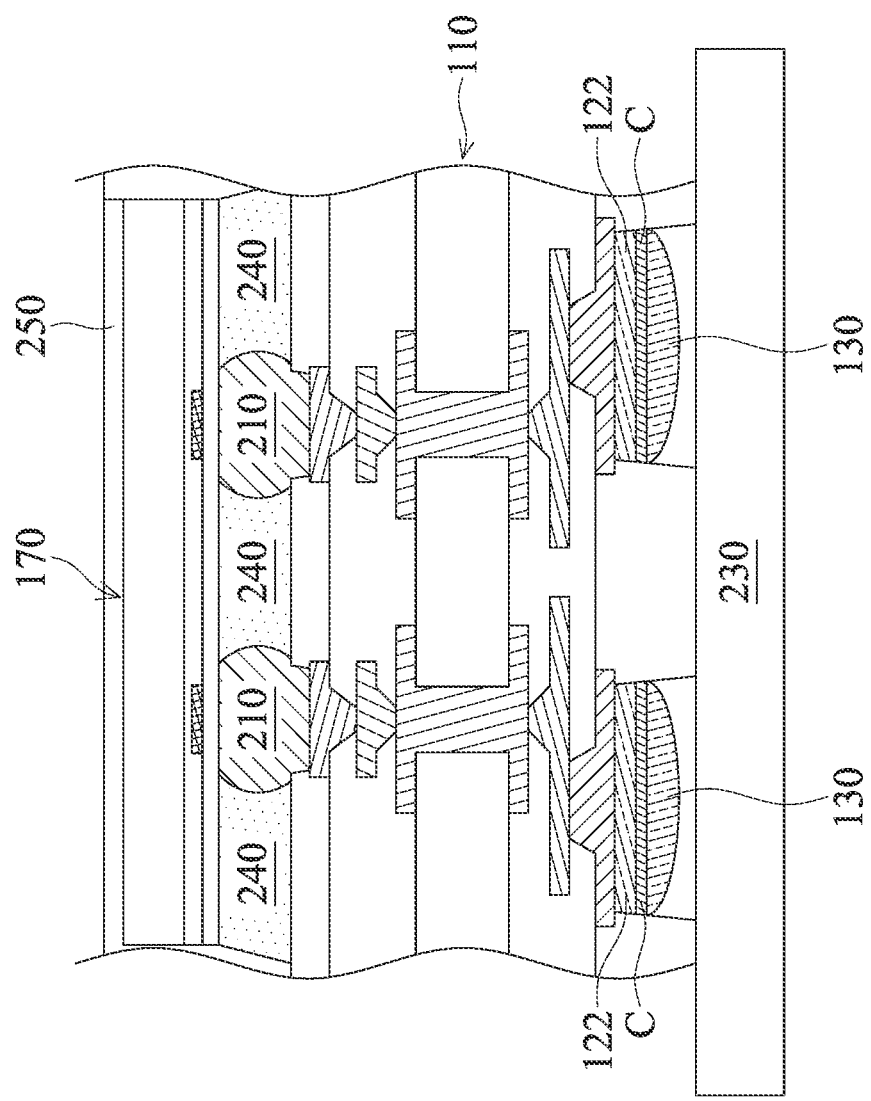

As shown in FIG. 1J, the wiring substrate 110 is disposed over a carrier substrate 230, in accordance with some embodiments. The carrier substrate 230 is configured to provide temporary mechanical and structural support during subsequent processing steps, in accordance with some embodiments. The carrier substrate 230 includes glass, silicon oxide, aluminum oxide, metal, a combination thereof, or the like, in accordance with some embodiments.

The carrier substrate 230 includes a metal frame, in accordance with some embodiments.

As shown in FIG. 1J, an underfill layer 240 is formed between the chip 170 and the wiring substrate 110, in accordance with some embodiments. The underfill layer 240 includes an insulating material, such as a polymer material, in accordance with some embodiments.

As shown in FIG. 1J, a molding layer 250 is formed over the wiring substrate 110, the chip 170 and the underfill layer 240, in accordance with some embodiments. The molding layer 250 encapsulates the chip 170, in accordance with some embodiments. The molding layer 250 surrounds the chip 170, the conductive bumps 210, and the underfill layer 240, in accordance with some embodiments. The molding layer 250 is made of an insulating material, such as a polymer material, in accordance with some embodiments.

Figure 1K:
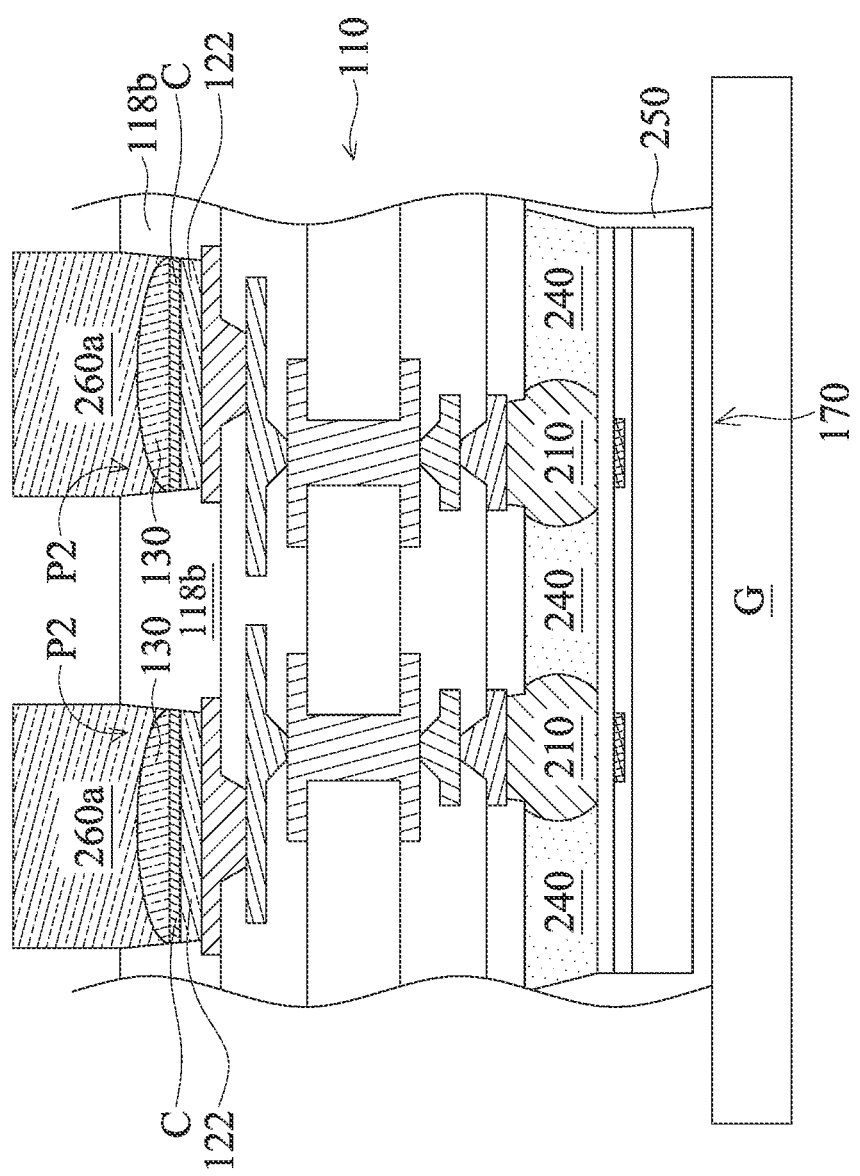

As shown in FIG. 1K, the wiring substrate 110 is flipped upside down and is disposed over a carrier substrate G, in accordance with some embodiments. The carrier substrate G is configured to provide temporary mechanical and structural support during subsequent processing steps, in accordance with some embodiments. The carrier substrate G includes glass, silicon oxide, aluminum oxide, metal, a combination thereof, or the like, in accordance with some embodiments. The carrier substrate G includes a metal frame, in accordance with some embodiments.

As shown in FIG. 1K, conductive structures 260a are formed over the conductive protection layer 130, in accordance with some embodiments. The conductive structures 260a are made of a conductive material such as metal (e.g., Sn) or alloys thereof, in accordance with some embodiments. In some embodiments, the conductive structures 260a and the conductive protection layer 130 are made of the same conductive material such as tin or tin alloy.

Figure 1L:
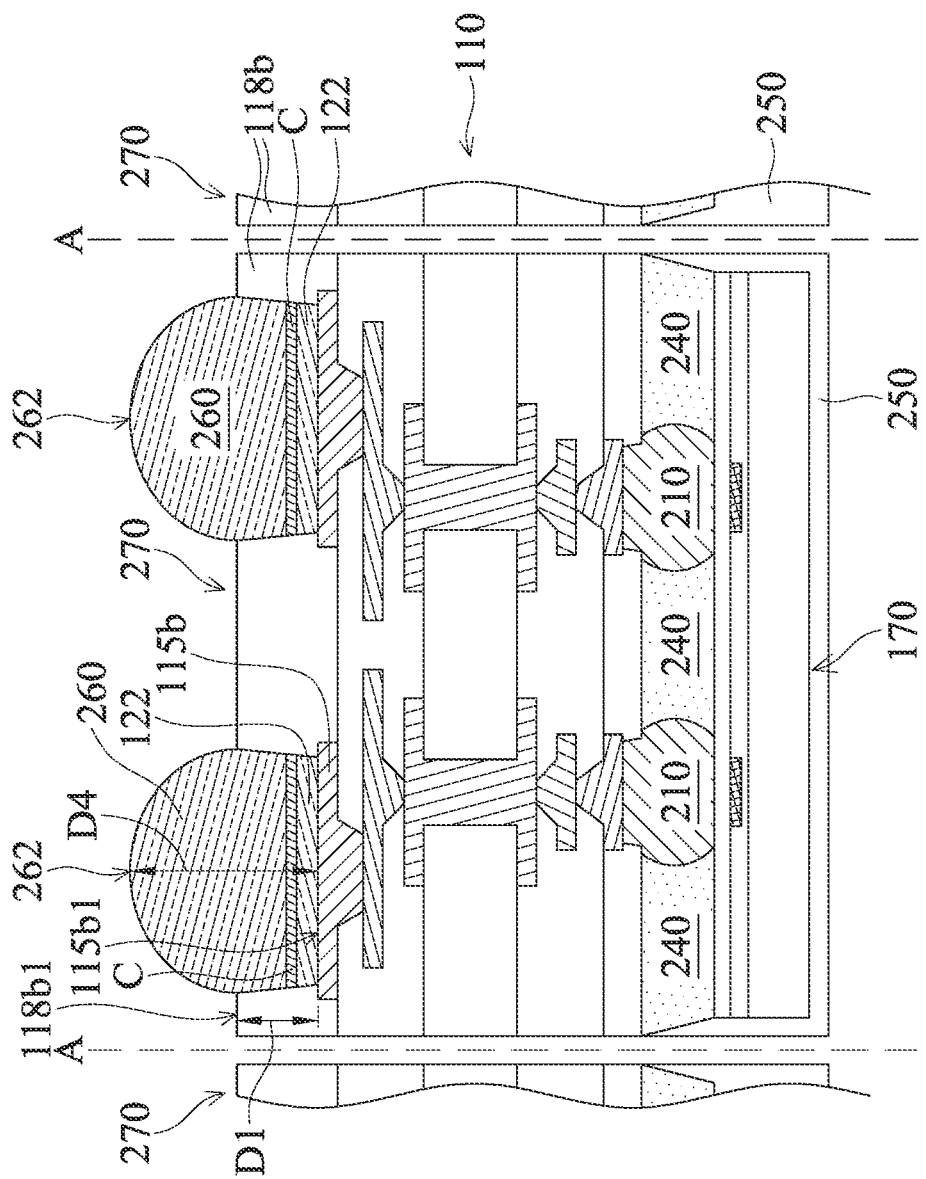

As shown in FIGS. 1K and 1L, a reflow process is performed over the conductive structures 260a and the conductive protection layer 130 to melt and mix the conductive structures 260a and the conductive protection layer 130 together so as to form conductive bumps 260, in accordance with some embodiments.

In some embodiments, a distance D4 between a top surface 262 of the conductive bumps 260 and the top surface 115b1 of the pads 115b is greater than the distance D1 between the top surface 118b1 of the insulating layer 118b and the top surface 115b1. The conductive bump 260 is wider and thicker than the conductive bump 210, in accordance with some embodiments. Therefore, the conductive bumps 260 are able to bonded with a wiring substrate with larger pads than that of the chip 170 in subsequent processes, in accordance with some embodiments.

As shown in FIG. 1L, a cutting process is performed over the wiring substrate 110 along cutting lines A to cut through the wiring substrate 110 and the molding layer 250 to form chip package structures 270, in accordance with some embodiments.

Figure 1M:
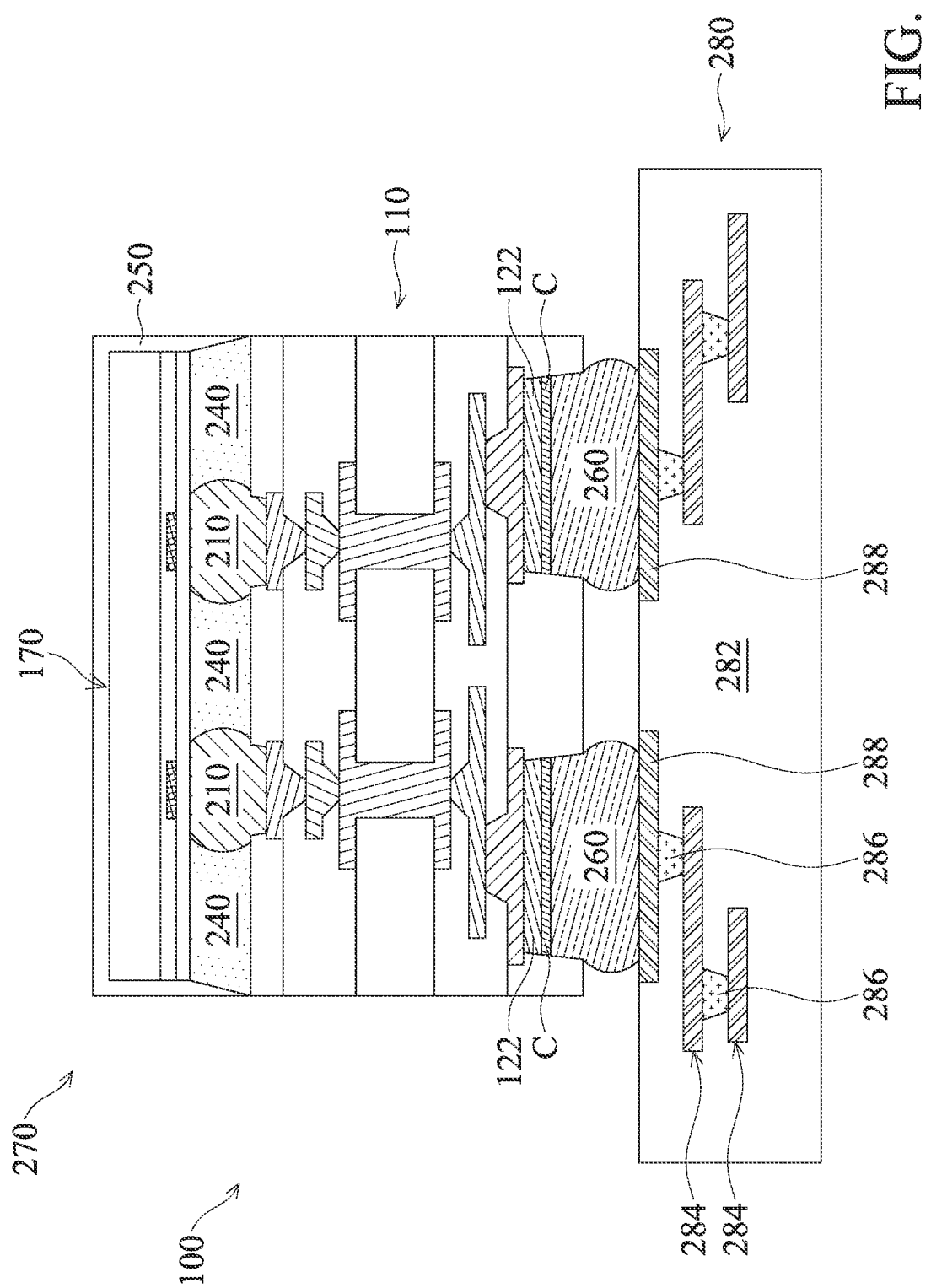

As shown in FIG. 1M, the chip package structure 270 is bonded to a wiring substrate 280 through the conductive bumps 260, in accordance with some embodiments. The wiring substrate 280 includes a printed circuit board or another suitable wiring substrate. The wiring substrate 280 includes an insulating layer 282, wiring layers 284, conductive vias 286, and pads 288, in accordance with some embodiments.

The wiring layers 284 and the conductive vias 286 are in the insulating layer 282, in accordance with some embodiments. The pads 288 are over the insulating layer 282, in accordance with some embodiments. The conductive vias 286 are electrically connected between the wiring layers 284 and between the wiring layer 284 and the pads 288, in accordance with some embodiments.

The wiring layers 284, the conductive vias 286, and the pads 288 are made of a conductive material such as a metal material or an alloy thereof, in accordance with some embodiments. The metal material includes aluminum, copper or tungsten.

In this step, a chip package structure (or board-level package structure) 100 is substantially formed, in accordance with some embodiments. The chip package structure 100 includes the chip package structure 270, the conductive bumps 260, and the wiring substrate 280, in accordance with some embodiments. The chip package structure 100 is a ball grid array (BGA) package structure, in accordance with some embodiments.

Figure 2A:
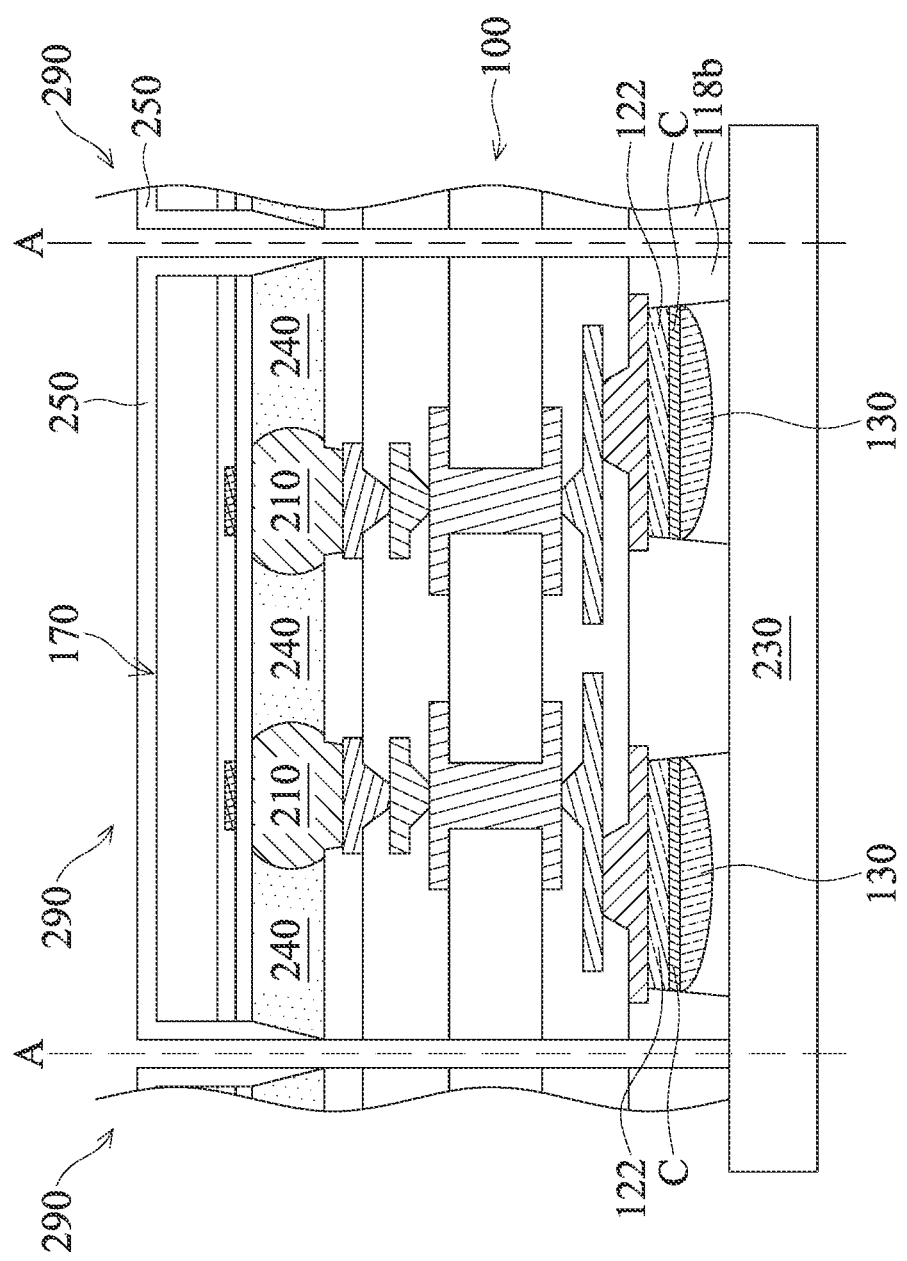
FIGS. 2A-2B are cross-sectional views of various stages of a process for forming a chip package structure, in accordance with some embodiments.
Figure 2B:
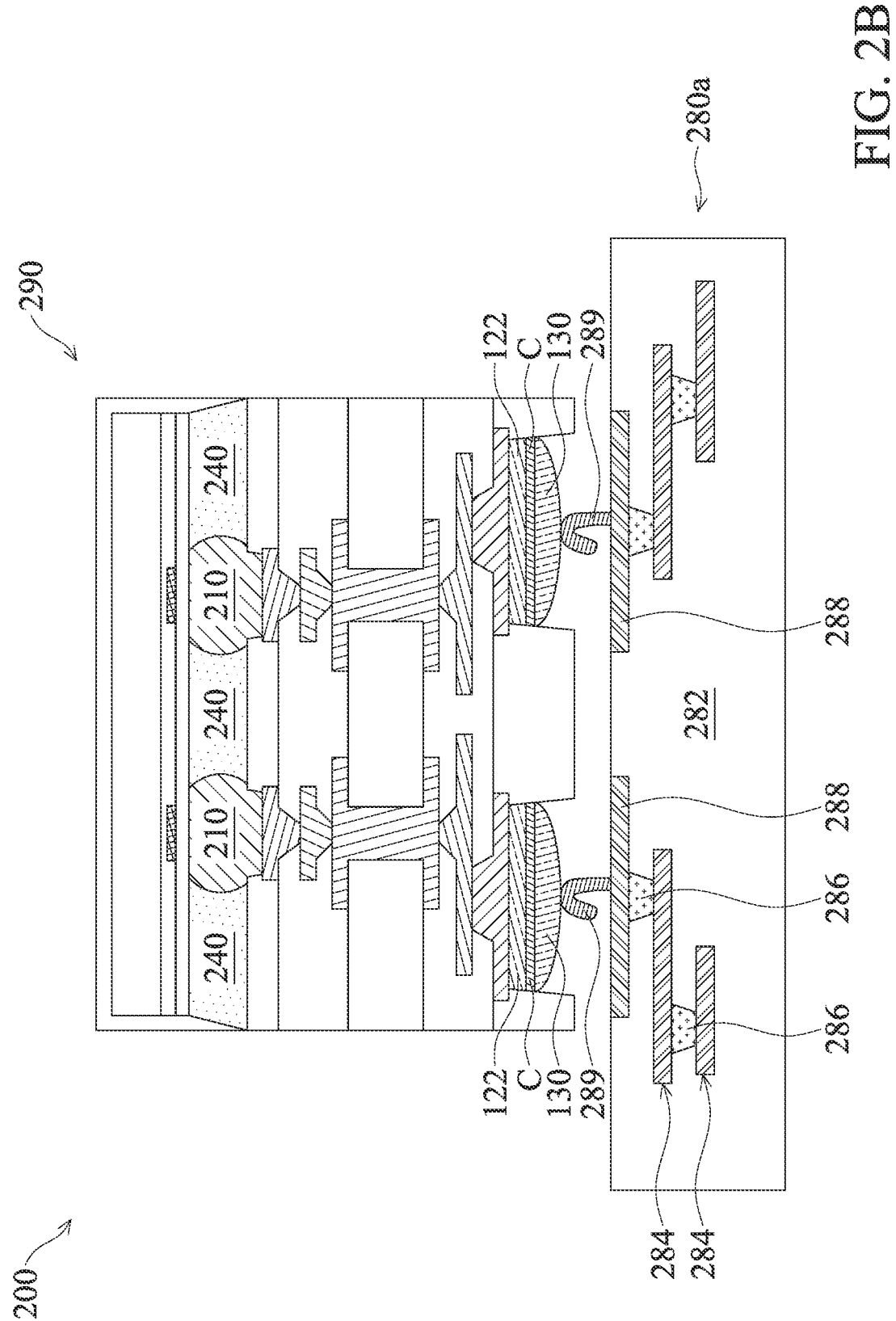

FIGS. 2A-2B are cross-sectional views of various stages of a process for forming a chip package structure, in accordance with some embodiments. As shown in FIG. 2A, after the step of FIG. 1J, a cutting process is performed over the wiring substrate 110 along cutting lines A to cut through the wiring substrate 110 and the molding layer 250 to form chip package structures 290, in accordance with some embodiments.

As shown in FIG. 2B, a wiring substrate 280a is provided, in accordance with some embodiments. The wiring substrate 280a is similar to the wiring substrate 280 of FIG. 1M, except that the wiring substrate 280a further includes resilient contact structures 289, in accordance with some embodiments. The resilient contact structures 289 are mounted to the pads 288, in accordance with some embodiments.

As shown in FIG. 2B, the chip package structure 290 is bonded to the wiring substrate 280a through the conductive protection layer 130 and the resilient contact structures 289, in accordance with some embodiments. The resilient contact structures 289 are in direct contact with the conductive protection layer 130, in accordance with some embodiments. The resilient contact structures 289 are resilient metal strips, in accordance with some embodiments.

In this step, a chip package structure (or board-level package structure) 200 is substantially formed, in accordance with some embodiments. The chip package structure 200 includes the chip package structure 290 and the wiring substrate 280a, in accordance with some embodiments. The chip package structure 200 is a land grid array (LGA) package structure, in accordance with some embodiments.

Figure 3:
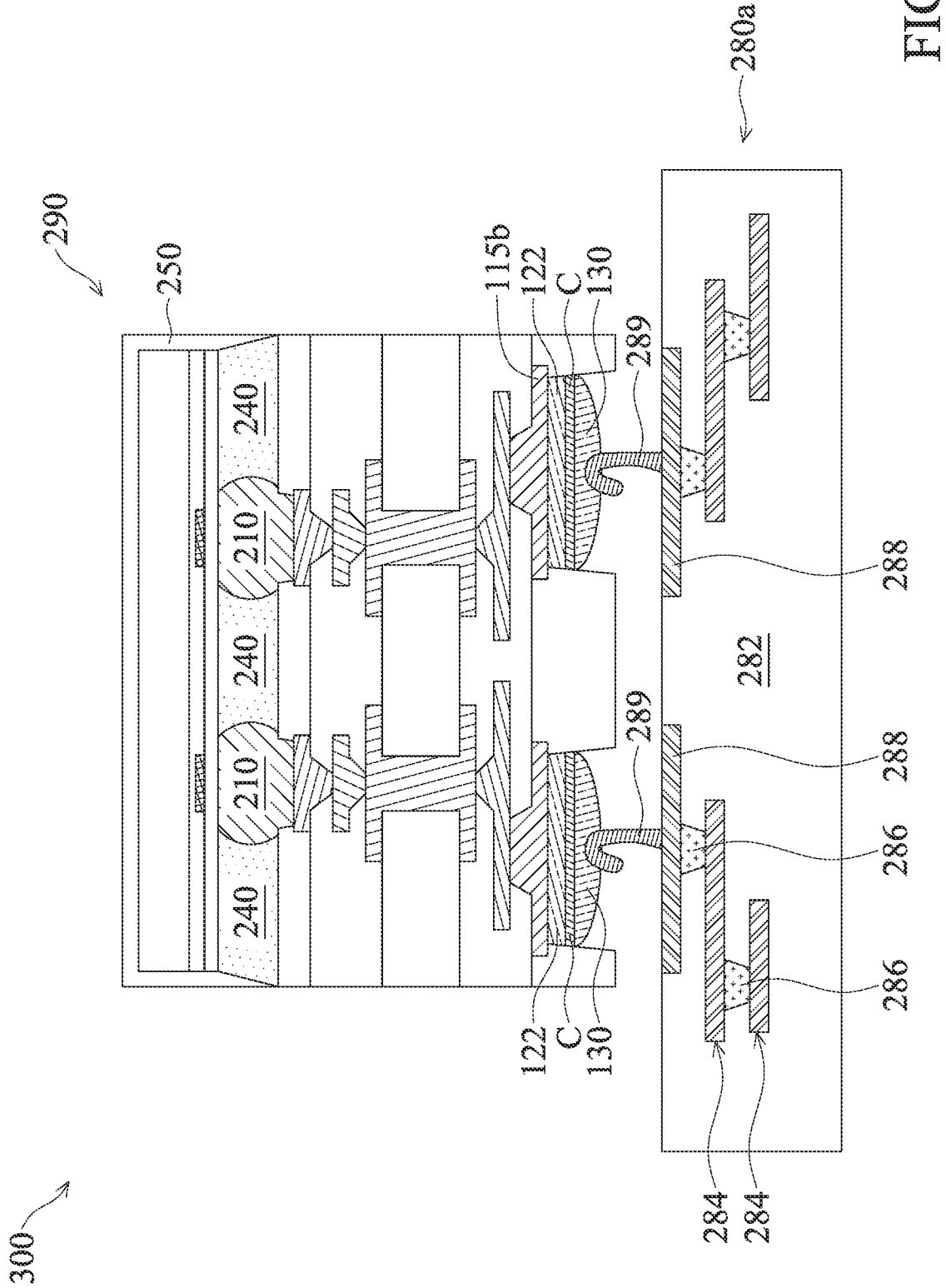
FIG. 3 is a cross-sectional view of a chip package structure, in accordance with some embodiments.

FIG. 3 is a cross-sectional view of a chip package structure (or board-level package structure) 300, in accordance with some embodiments. As shown in FIG. 3, the chip package structure 300 is similar to the chip package structure 200 of FIG. 2B, except that the resilient contact structures 289 of the chip package structure 300 penetrate into the conductive protection layer 130, in accordance with some embodiments. The conductive protection layer 130 may secure the resilient contact structures 289 to the pads 115b to improve the yield of the chip package structure 300. The chip package structure 300 is a land grid array (LGA) package structure, in accordance with some embodiments.

Figure 4A:
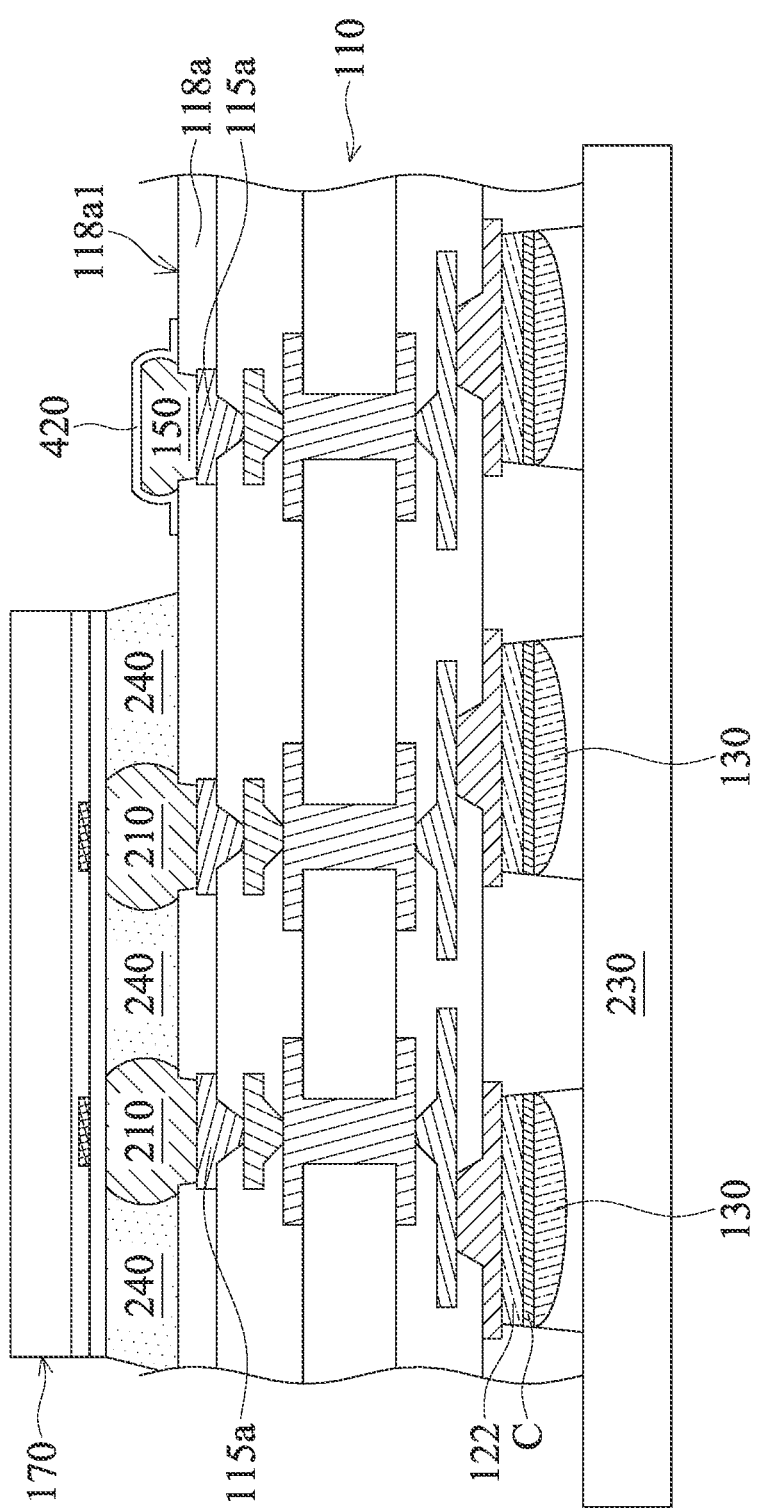
FIGS. 4A-4H are cross-sectional views of various stages of a process for forming a chip package structure, in accordance with some embodiments.

FIGS. 4A-4H are cross-sectional views of various stages of a process for forming a chip package structure, in accordance with some embodiments. As shown in FIG. 4A, after the step of FIG. 1I, the wiring substrate 110 is disposed over the carrier substrate 230, in accordance with some embodiments. As shown in FIG. 4A, a portion of the conductive layer 150 is not bonded to the chip 170, in accordance with some embodiments.

As shown in FIG. 4A, an underfill layer 240 is formed between the chip 170 and the wiring substrate 110, in accordance with some embodiments. As shown in FIG. 4A, a flux layer 420 is formed over the portion of the conductive layer 150 and the top surface 118a1 of the insulating layer 118a, in accordance with some embodiments.

In some embodiments, the flux layer 420 includes tartaric acid, a resin, an amine, and/or a solvent. In some embodiments, the amine is an alkyl substituted amine, an ethanol amine, an ethoxylated amine, or a propoxylated amine. In some embodiments, a surfactant is used, sometimes referred to as a flow modifier. The specific surfactant depends upon compatibility with the flux layer 420. In some embodiments, the surfactant is anionic such as long chain alkyl carboxylic acids, such as lauric acids, steric acids, or the like. The flux layer 420 is formed using a dipping process or a jetting process, in accordance with some embodiments.

Figure 4B:
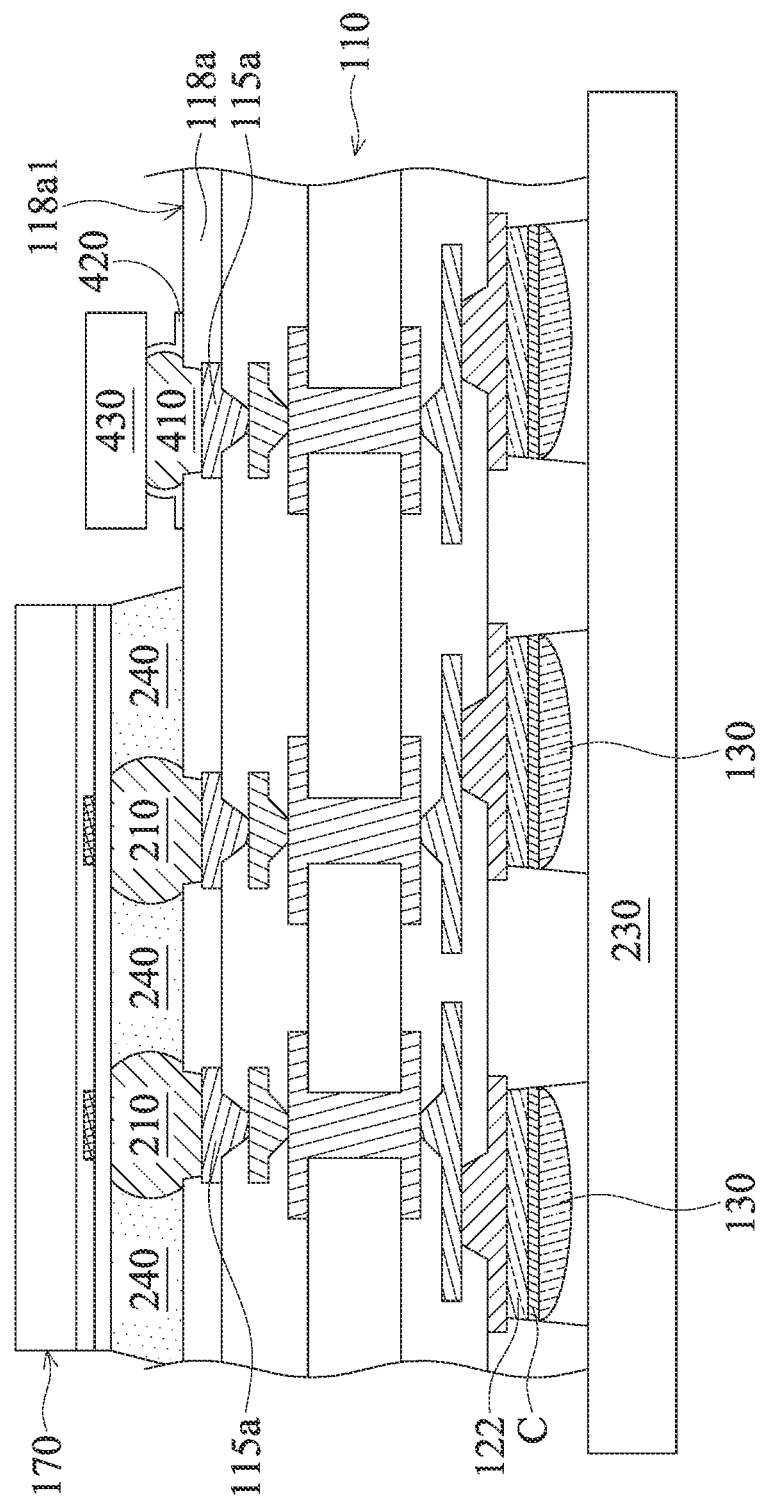

As shown in FIG. 4B, a device 430 is bonded to the wiring substrate 110 through a conductive bump 410, in accordance with some embodiments. The conductive bump 410 is partially formed from the portion of the conductive layer 150, in accordance with some embodiments. The device 430 includes an active device or a passive device such as a resistor, a capacitor, or an inductor, in accordance with some embodiments.

Figure 4C:
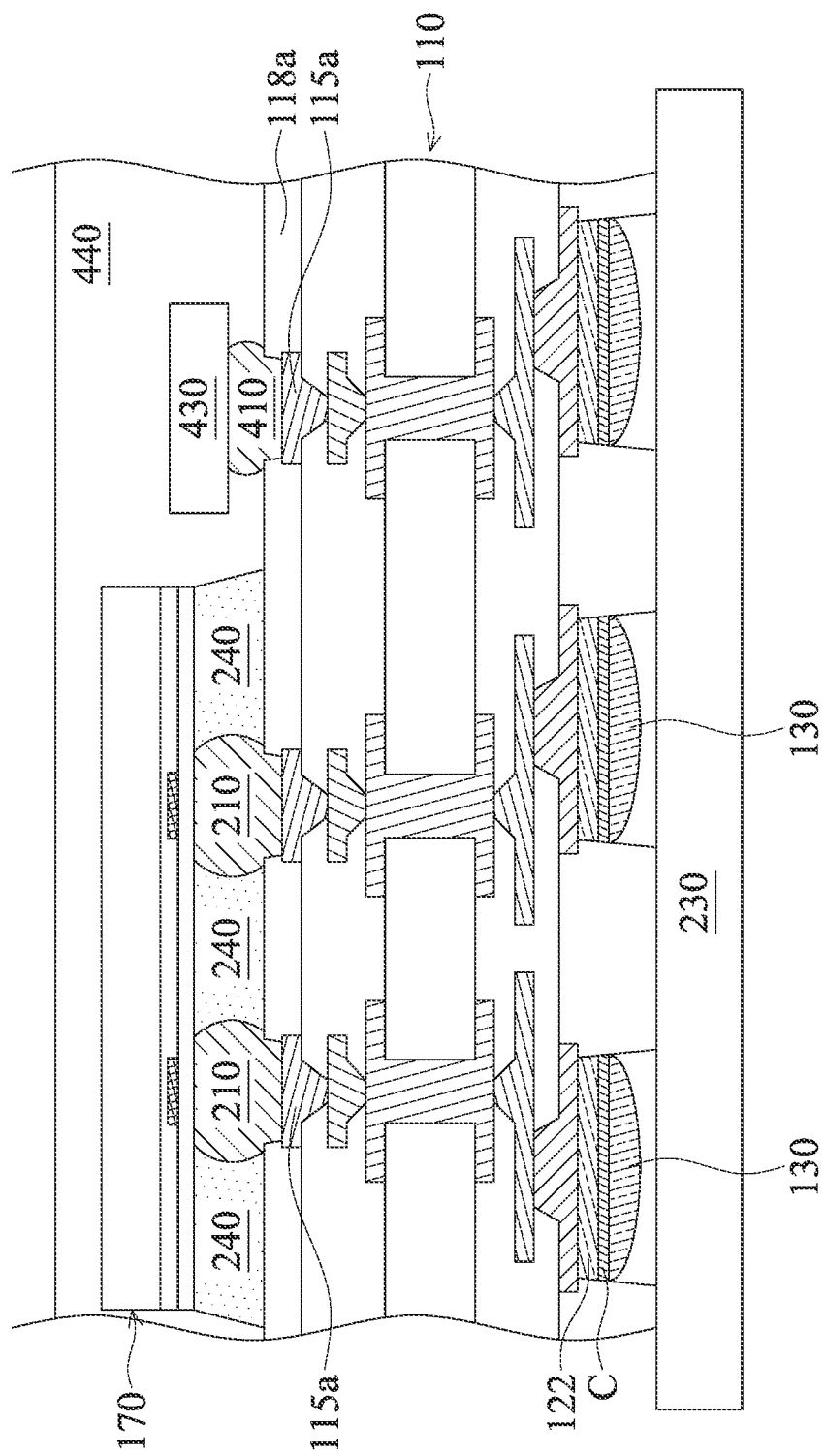

As shown in FIG. 4C, the flux layer 420 is removed using a deflux process, in accordance with some embodiments. As shown in FIG. 4C, a molding layer 440 is formed over the wiring substrate 110, the chip 170, the underfill layer 240, the device 430, and the conductive bump 410, in accordance with some embodiments. The molding layer 440 encapsulates the chip 170 and the device 430, in accordance with some embodiments.

The molding layer 440 surrounds the chip 170, the conductive bumps 210, the underfill layer 240, the device 430, and the conductive bump 410, in accordance with some embodiments. The molding layer 440 is made of an insulating material, such as a polymer material, in accordance with some embodiments.

Figure 4D:
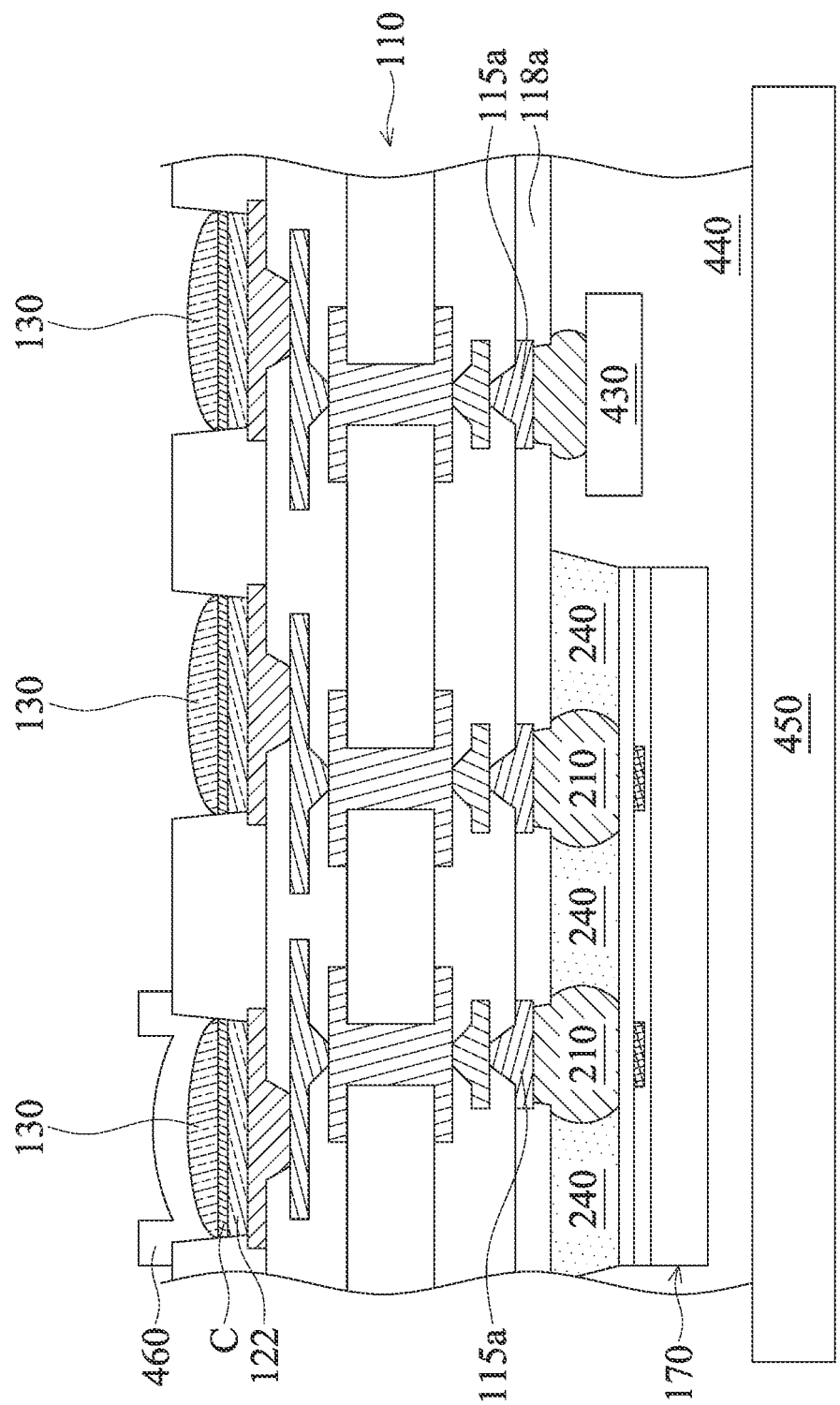

As shown in FIG. 4D, the wiring substrate 110 is flipped upside down and is disposed over a carrier substrate 450, in accordance with some embodiments. The carrier substrate 450 is configured to provide temporary mechanical and structural support during subsequent processing steps, in accordance with some embodiments. The carrier substrate 450 includes glass, silicon oxide, aluminum oxide, metal, a combination thereof, or the like, in accordance with some embodiments. The carrier substrate 450 includes a metal frame, in accordance with some embodiments.

As shown in FIG. 4D, a flux layer 460 is formed over a portion of the conductive protection layer 130, in accordance with some embodiments. In some embodiments, the flux layer 460 includes tartaric acid, a resin, an amine, and/or a solvent. In some embodiments, the amine is an alkyl substituted amine, an ethanol amine, an ethoxylated amine, or a propoxylated amine.

In some embodiments, a surfactant is used, sometimes referred to as a flow modifier. The specific surfactant depends upon compatibility with the flux layer 460. In some embodiments, the surfactant is anionic such as long chain alkyl carboxylic acids, such as lauric acids, steric acids, or the like. The flux layer 460 is formed using a dipping process or a jetting process, in accordance with some embodiments.

Figure 4E:
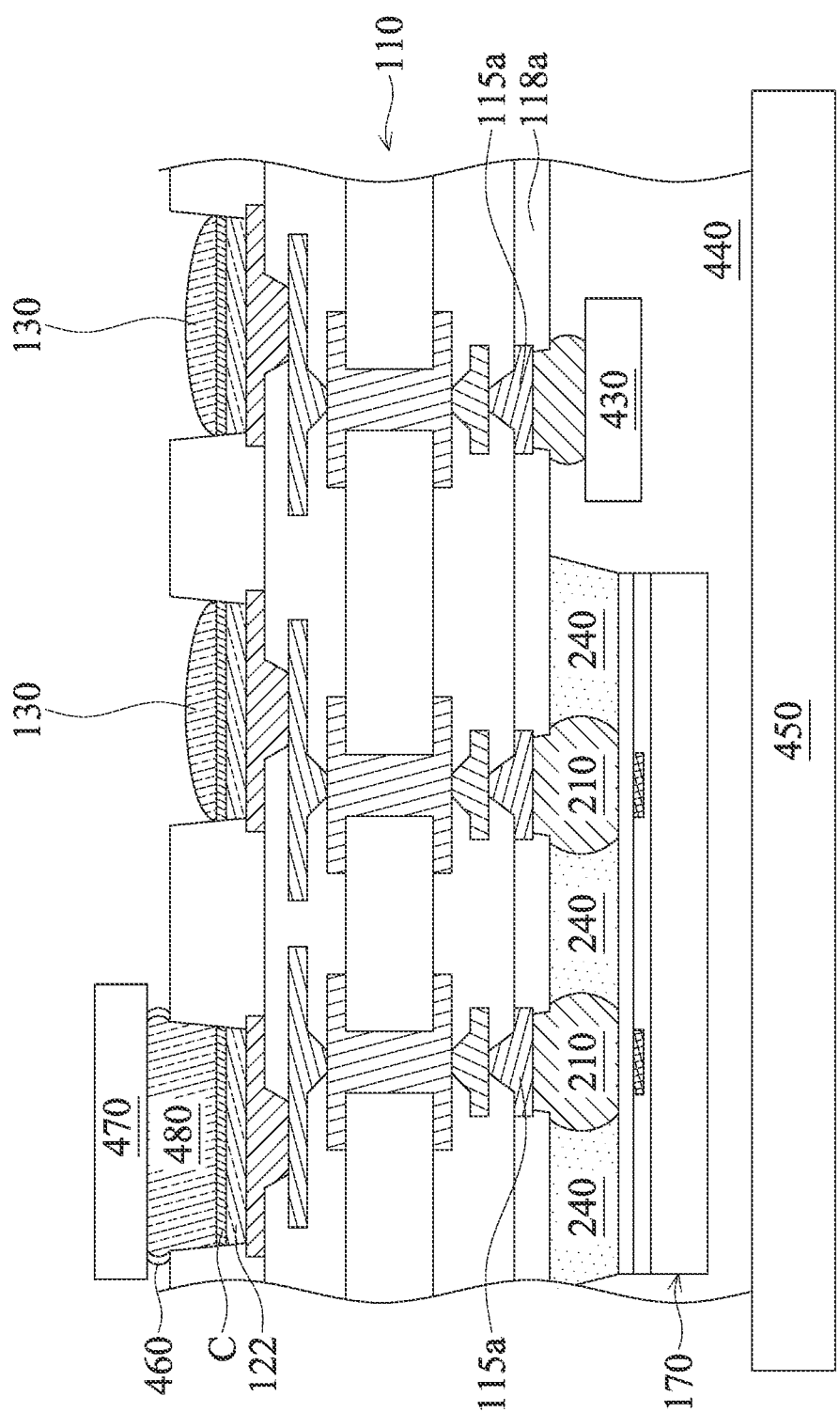

As shown in FIG. 4E, a device 470 is bonded to the wiring substrate 110 through a conductive bump 480, in accordance with some embodiments. The conductive bump 480 is partially formed from the portion of the conductive protection layer 130, in accordance with some embodiments. The device 470 includes an active device or a passive device such as a resistor, a capacitor, or an inductor, in accordance with some embodiments.

Figure 4F:
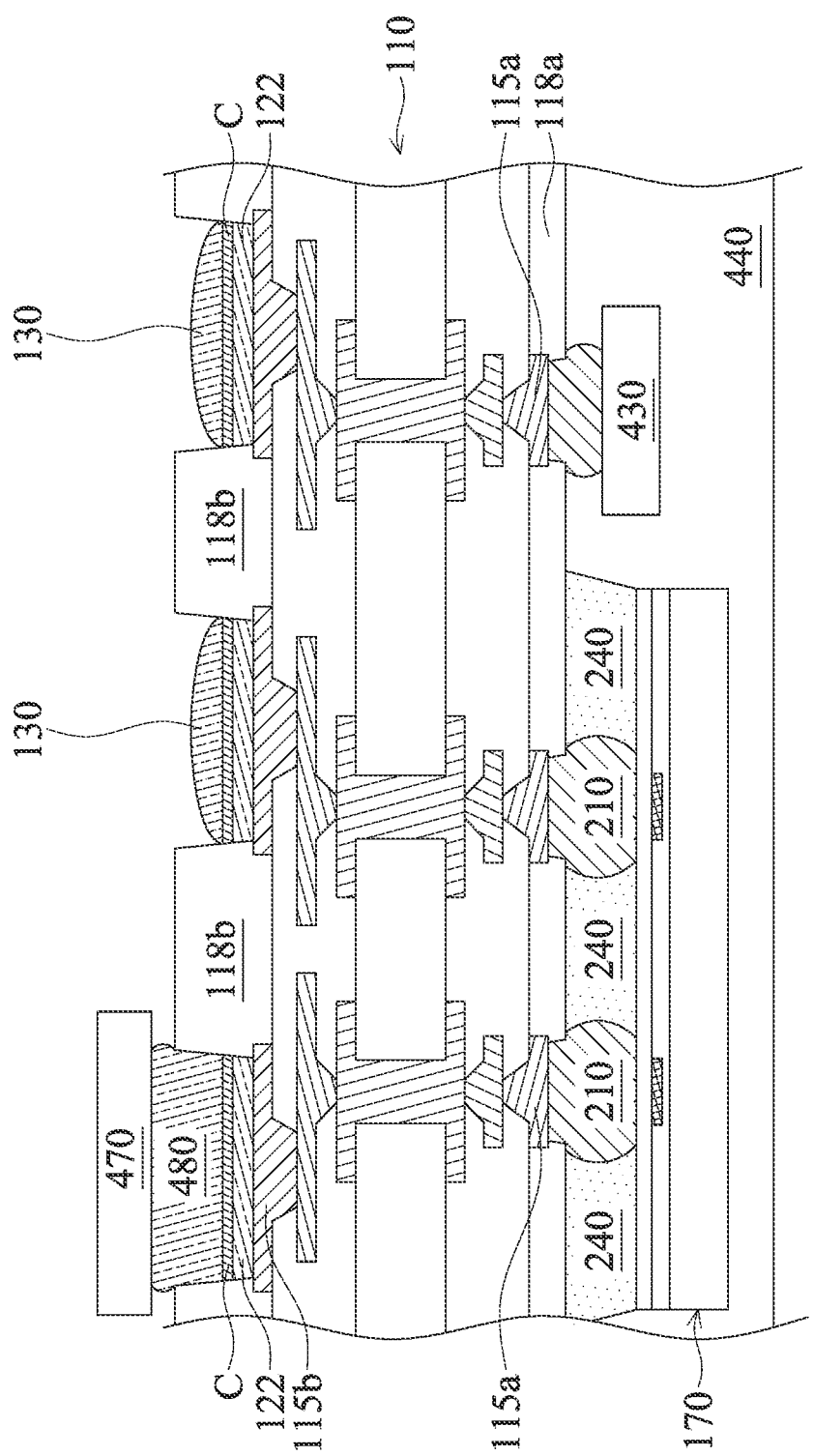
Figure 4G:
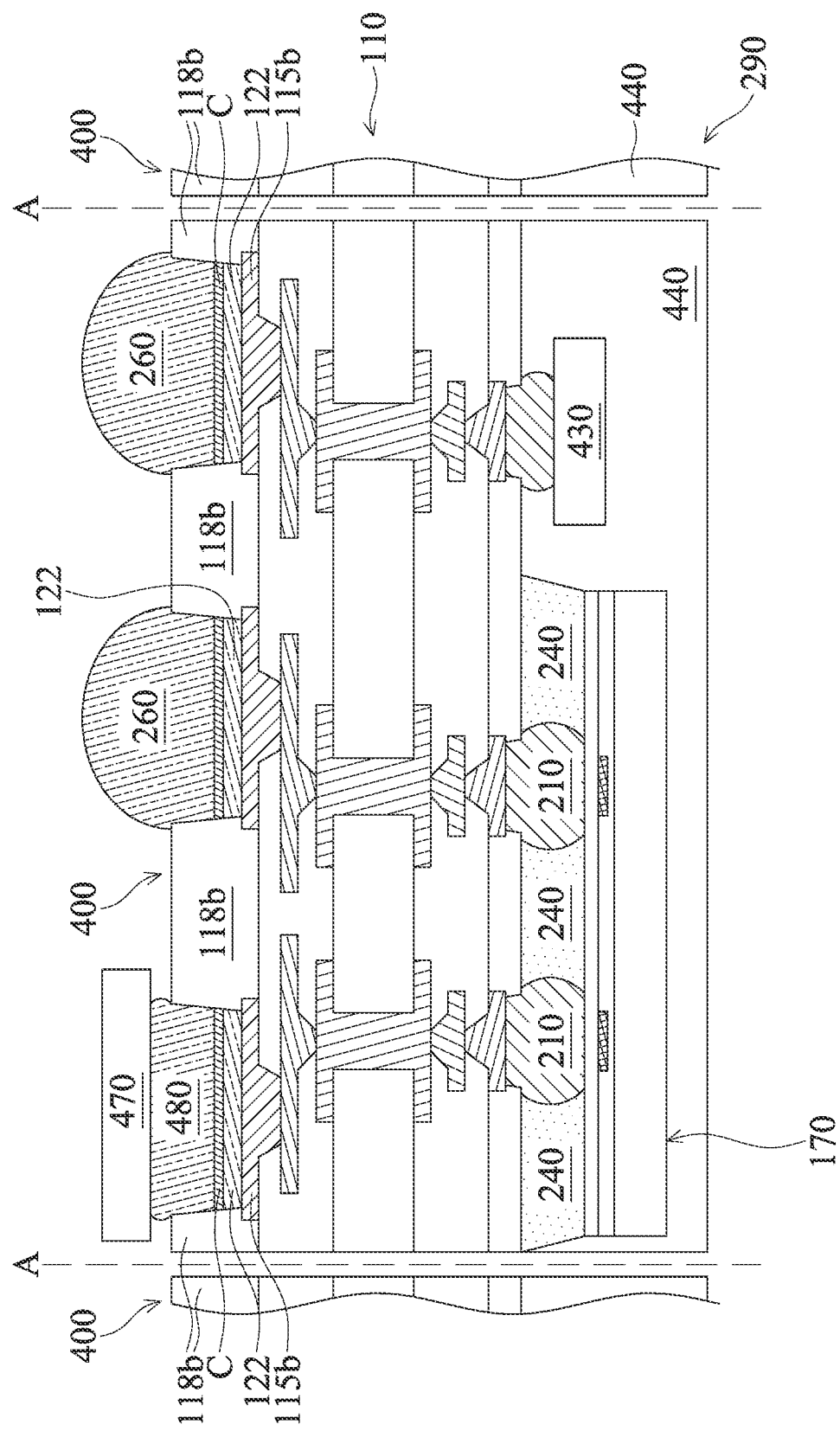
Figure 4H:
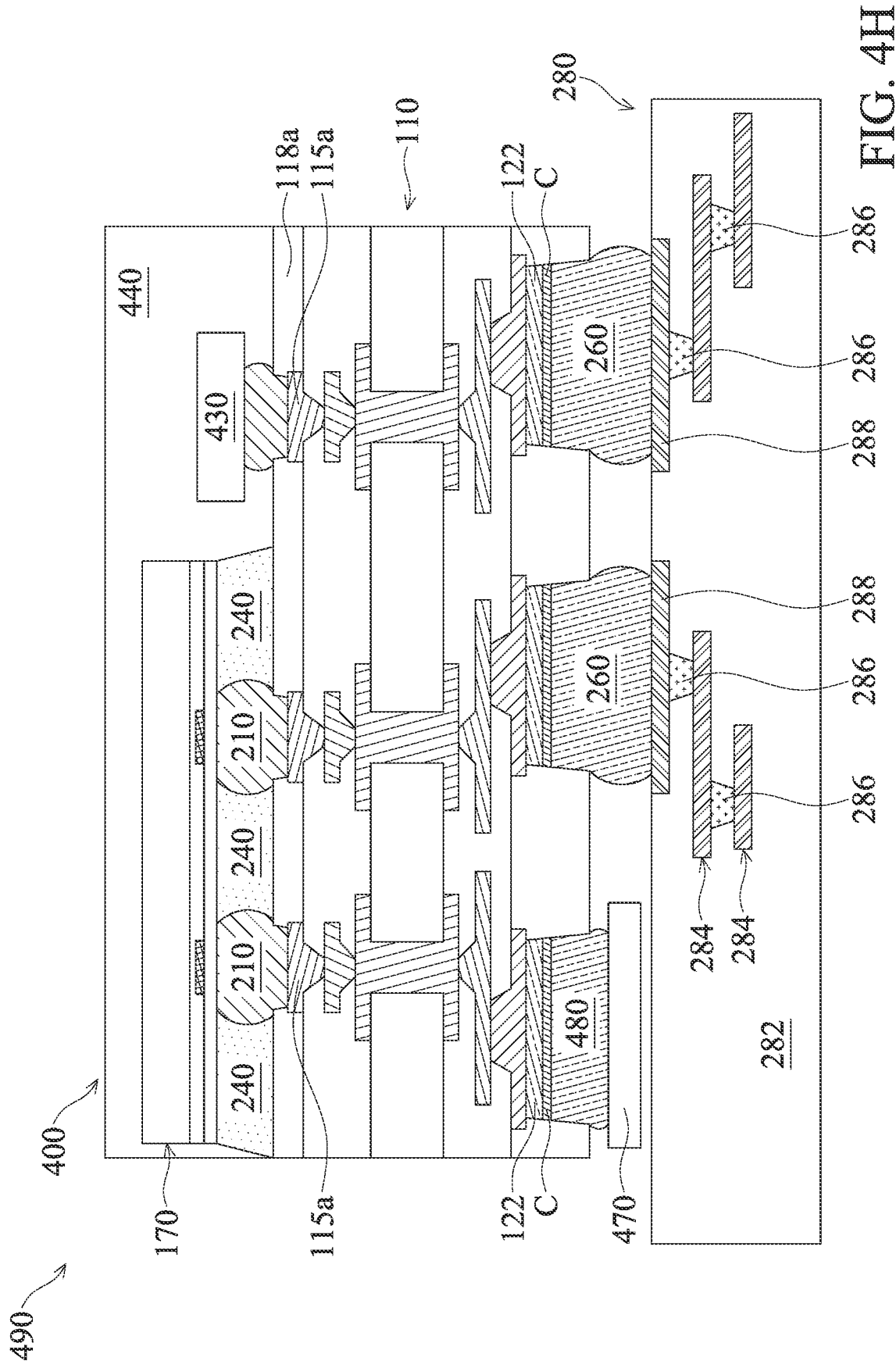

As shown in FIG. 4F, the flux layer 460 is removed using a deflux process, in accordance with some embodiments. As shown in FIG. 4G, the steps of FIGS. 1K-1L is performed to form the conductive bumps 260 and to form chip package structures (or board-level package structures) 400, in accordance with some embodiments. As shown in FIG. 4H, the step of FIG. 1M is performed to bond the chip package structure 400 to the wiring substrate 280 through the conductive bumps 260, in accordance with some embodiments.

In this step, a chip package structure 490 is substantially formed, in accordance with some embodiments. The chip package structure 490 includes the chip package structure 400, the conductive bumps 260, and the wiring substrate 280, in accordance with some embodiments. The chip package structure 490 is a ball grid array (BGA) package structure, in accordance with some embodiments.

Figure 5A:
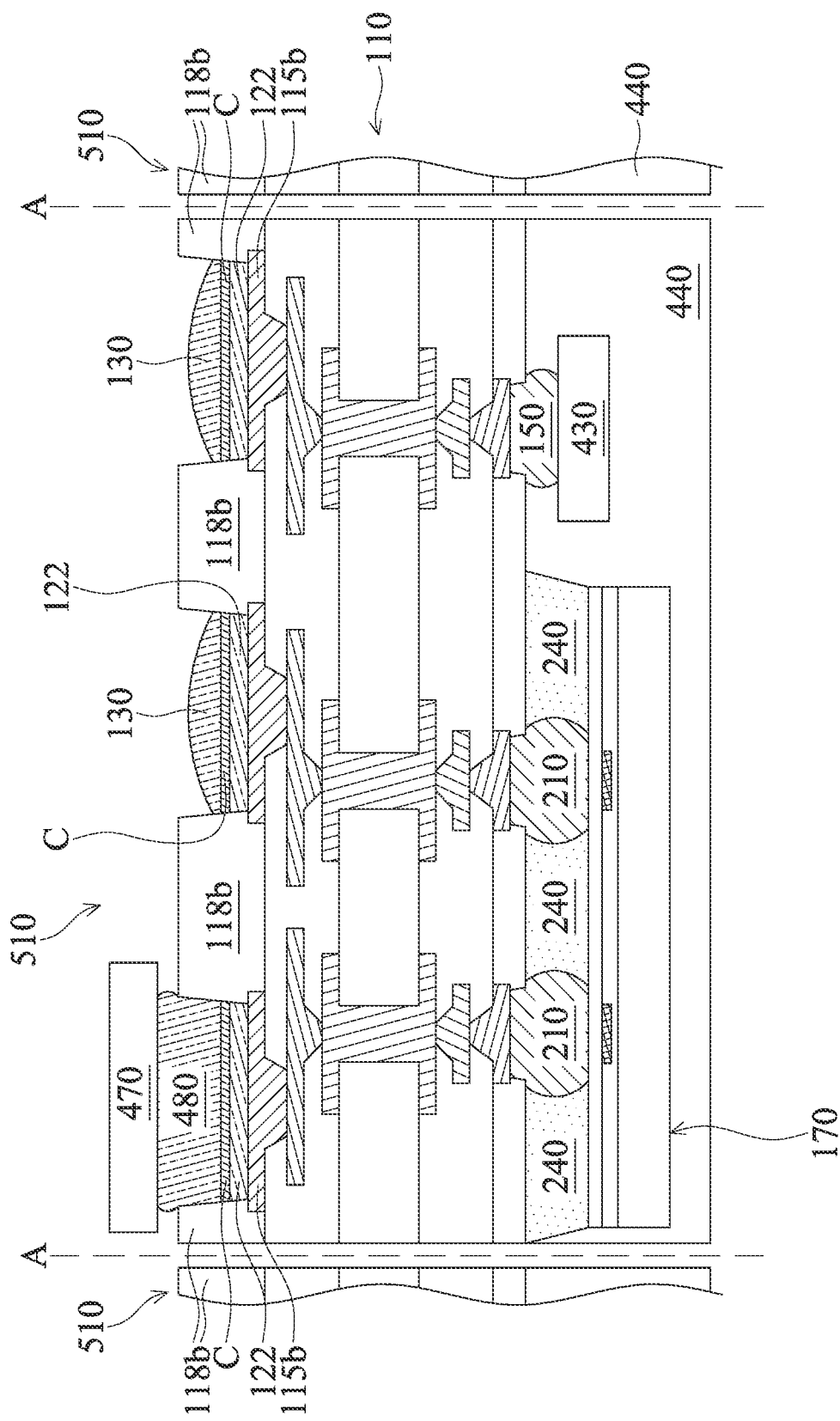
FIGS. 5A-5B are cross-sectional views of various stages of a process for forming a chip package structure, in accordance with some embodiments.
Figure 5B:
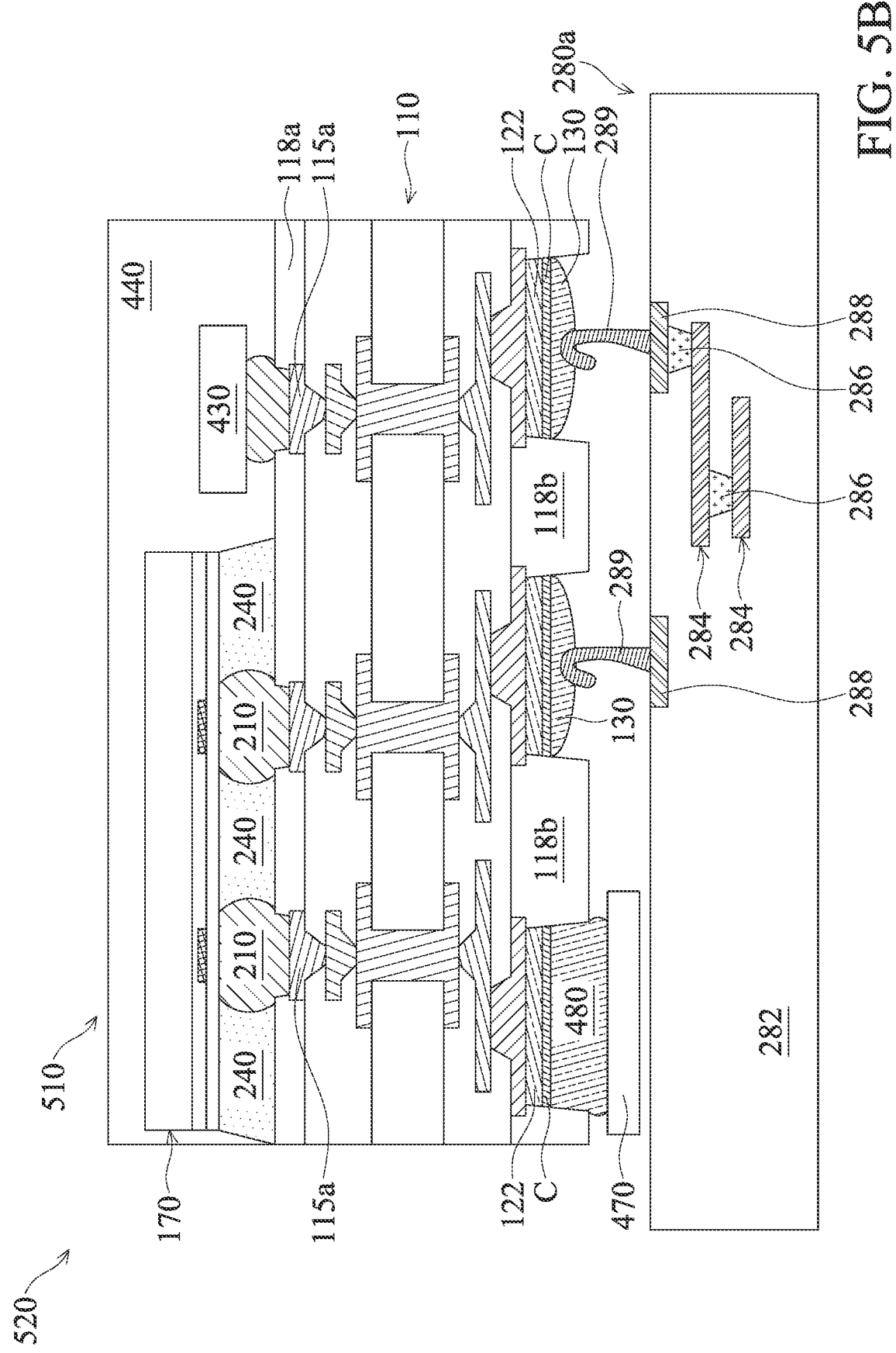

FIGS. 5A-5B are cross-sectional views of various stages of a process for forming a chip package structure, in accordance with some embodiments. As shown in FIG. 5A, after the step of FIG. 4F, a cutting process is performed over the wiring substrate 110 along cutting lines A to cut through the wiring substrate 110 and the molding layer 440 to form chip package structures 510, in accordance with some embodiments.

As shown in FIG. 5B, the chip package structure 510 is bonded to the wiring substrate 280a through the conductive protection layer 130 and the resilient contact structures 289, in accordance with some embodiments. The resilient contact structures 289 are in direct contact with the conductive protection layer 130, in accordance with some embodiments. The resilient contact structures 289 are resilient metal strips, in accordance with some embodiments. The resilient contact structures 289 penetrate into the conductive protection layer 130, in accordance with some embodiments.

In this step, a chip package structure (or board-level package structure) 520 is substantially formed, in accordance with some embodiments. The chip package structure 520 includes the chip package structure 510 and the wiring substrate 280a, in accordance with some embodiments. The chip package structure 520 is a land grid array (LGA) package structure, in accordance with some embodiments.

Figure 6:
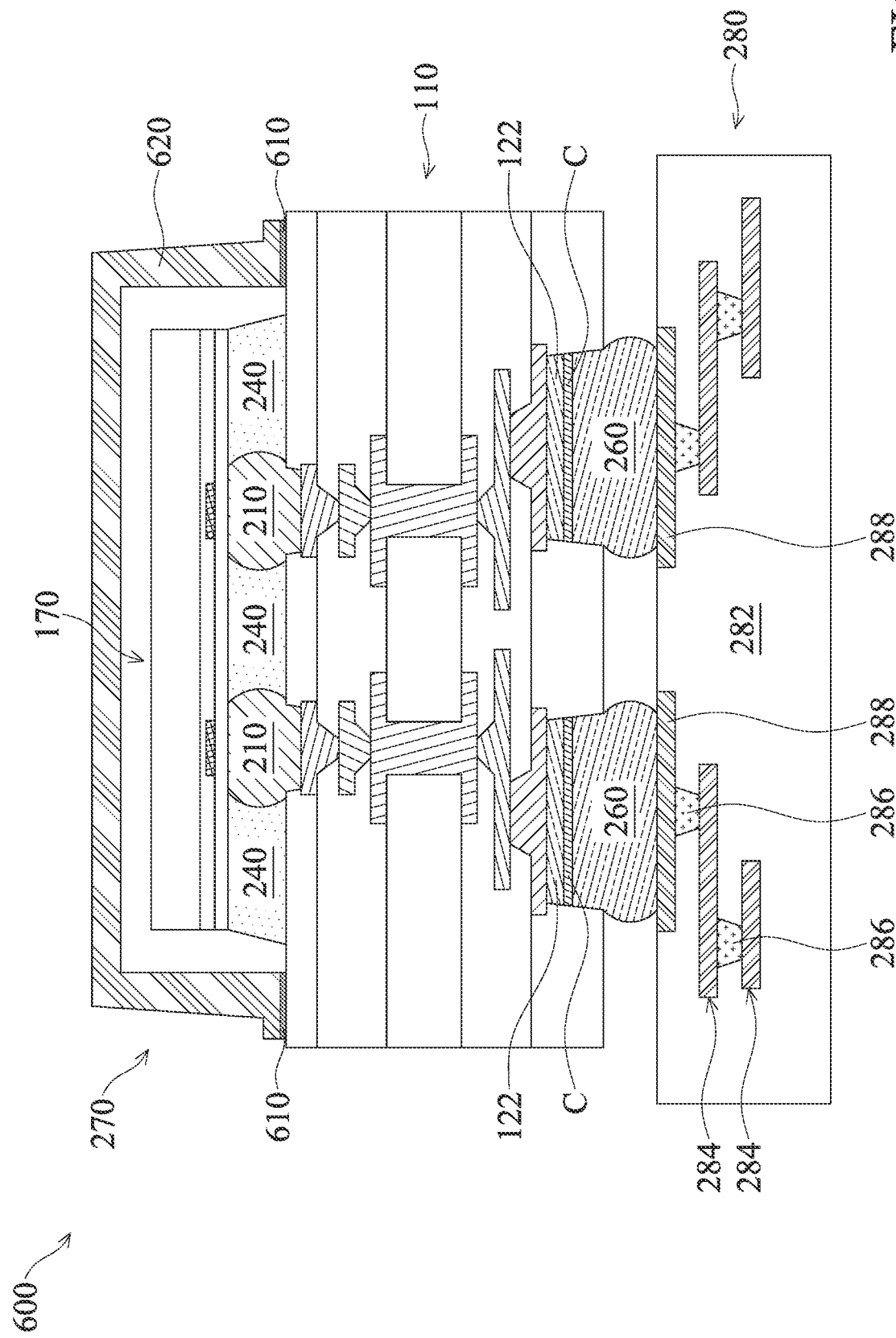
FIG. 6 is a cross-sectional view of a chip package structure, in accordance with some embodiments.

FIG. 6 is a cross-sectional view of a chip package structure 600, in accordance with some embodiments. As shown in FIG. 6, the chip package structure 600 is similar to the chip package structure 100 of FIG. 1M, except that the chip package structure 600 further has an adhesive layer 610 and a heat-spreading lid 620, in accordance with some embodiments. The chip package structure 600 does not have the molding layer 250 of the chip package structure 100, in accordance with some embodiments.

The adhesive layer 610 is formed over the wiring substrate 110, in accordance with some embodiments. The adhesive layer 610 surrounds the chip 170 and the underfill layer 240, in accordance with some embodiments. The adhesive layer 610 has a ring shape, in accordance with some embodiments. The heat-spreading lid 620 is disposed over the chip 170 and the adhesive layer 610, in accordance with some embodiments.

The adhesive layer 610 is made of polymer, such as epoxy or silicone, in accordance with some embodiments. The adhesive layer 610 is formed using a dispensing process, in accordance with some embodiments. The heat-spreading lid 620 is made of a high thermal conductivity material, such as a metal material (aluminum or copper), an alloy material (e.g., stainless steel), or aluminum-silicon carbide (AlSiC), in accordance with some embodiments.

Figure 7:
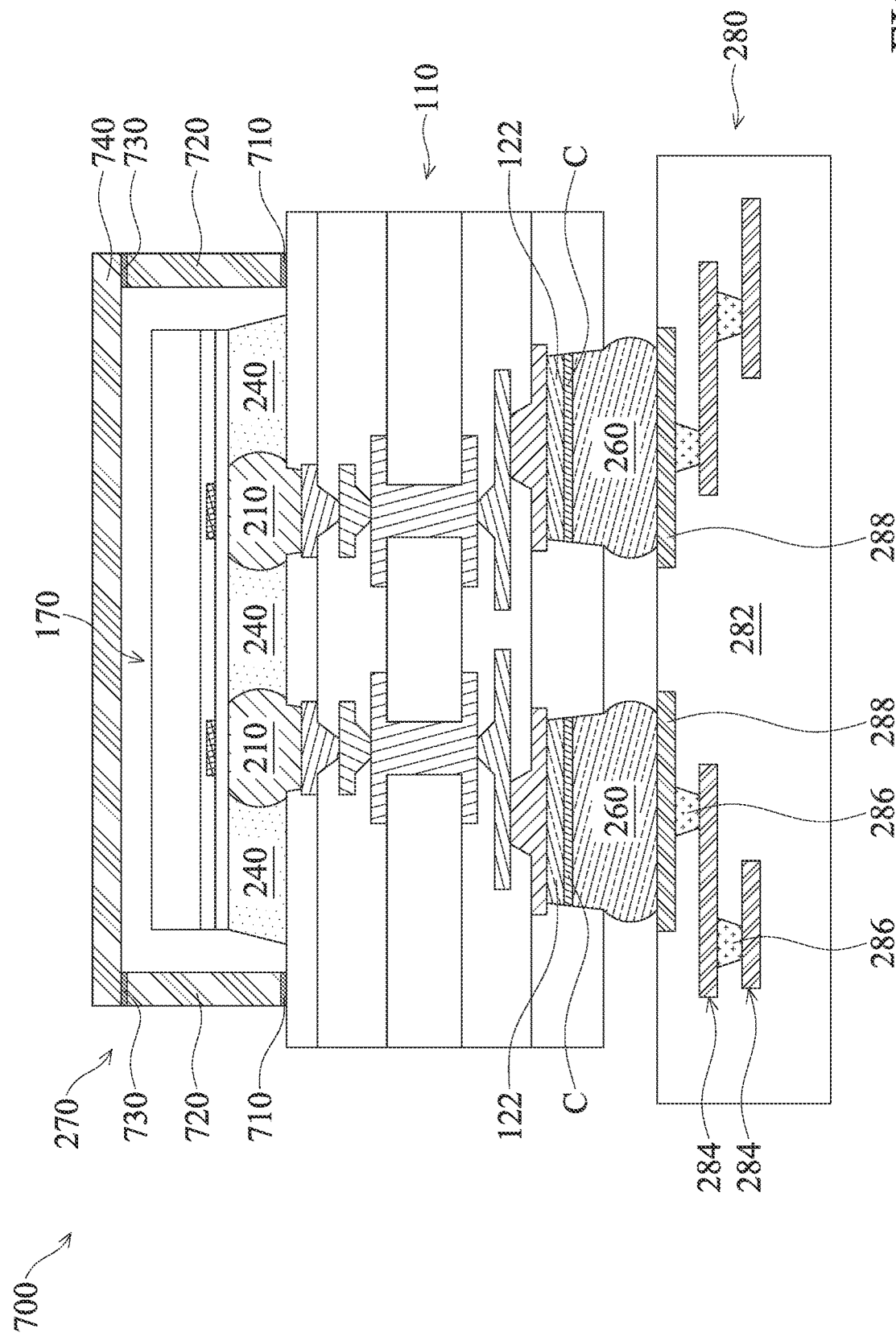
FIG. 7 is a cross-sectional view of a chip package structure, in accordance with some embodiments.

FIG. 7 is a cross-sectional view of a chip package structure 700, in accordance with some embodiments. As shown in FIG. 7, the chip package structure 700 is similar to the chip package structure 100 of FIG. 1M, except that the chip package structure 700 further has an adhesive layer 710, a heat-spreading ring 720, an adhesive layer 730 and a heat-spreading plate 740, in accordance with some embodiments. The chip package structure 700 does not have the molding layer 250 of the chip package structure 100, in accordance with some embodiments.

The adhesive layer 710 is formed over the wiring substrate 110, in accordance with some embodiments. The adhesive layer 710 surrounds the chip 170 and the underfill layer 240, in accordance with some embodiments. The adhesive layer 710 has a ring shape, in accordance with some embodiments. The heat-spreading ring 720 is disposed over the adhesive layer 710, in accordance with some embodiments.

The adhesive layer 730 is formed over the heat-spreading ring 720, in accordance with some embodiments. The adhesive layer 730 has a ring shape, in accordance with some embodiments. The heat-spreading plate 740 is disposed over the adhesive layer 730 and the chip 170, in accordance with some embodiments.

The adhesive layers 710 and 730 are made of polymer, such as epoxy or silicone, in accordance with some embodiments. The adhesive layers 710 and 730 are formed using a dispensing process, in accordance with some embodiments.

The heat-spreading ring 720 and the heat-spreading plate 740 are made of a high thermal conductivity material, such as a metal material (aluminum or copper), an alloy material (e.g., stainless steel), or aluminum-silicon carbide (AlSiC), in accordance with some embodiments.

Figure 8:
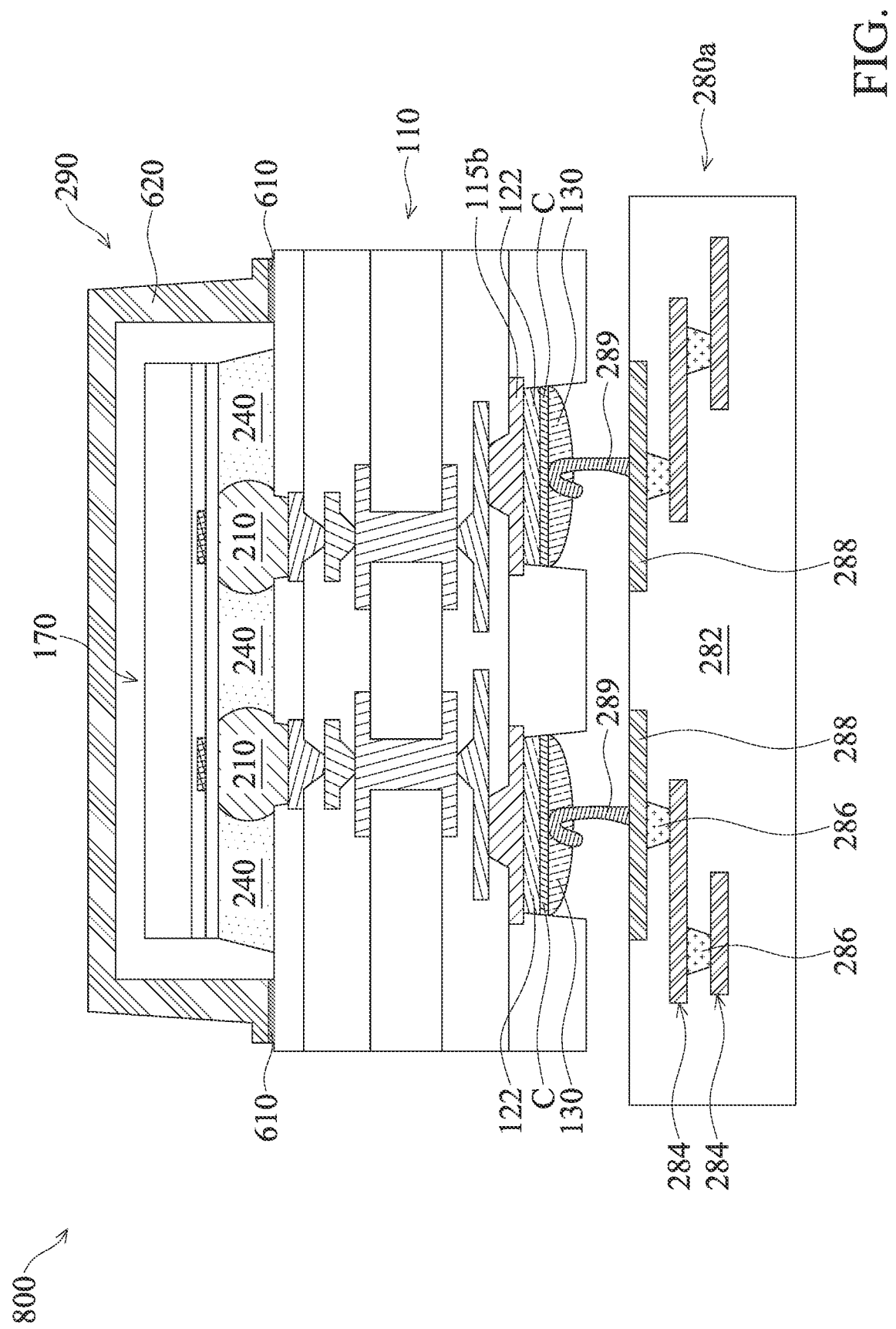
FIG. 8 is a cross-sectional view of a chip package structure, in accordance with some embodiments.

FIG. 8 is a cross-sectional view of a chip package structure 800, in accordance with some embodiments. As shown in FIG. 8, the chip package structure 800 is similar to the chip package structure 300 of FIG. 3, except that the chip package structure 800 further has an adhesive layer 610 and a heat-spreading lid 620, in accordance with some embodiments.

The chip package structure 800 does not have the molding layer 250 of the chip package structure 300, in accordance with some embodiments. The resilient contact structures 289 pass through the conductive protection layer 130, in accordance with some embodiments. The resilient contact structures 289 are in direct contact with the intermetallic compound layer C, in accordance with some embodiments.

The adhesive layer 610 is formed over the wiring substrate 110, in accordance with some embodiments. The adhesive layer 610 surrounds the chip 170 and the underfill layer 240, in accordance with some embodiments. The adhesive layer 610 has a ring shape, in accordance with some embodiments. The heat-spreading lid 620 is disposed over the chip 170 and the adhesive layer 610, in accordance with some embodiments.

The adhesive layer 610 is made of polymer, such as epoxy or silicone, in accordance with some embodiments. The adhesive layer 610 is formed using a dispensing process, in accordance with some embodiments. The heat-spreading lid 620 is made of a high thermal conductivity material, such as a metal material (aluminum or copper), an alloy material (e.g., stainless steel), or aluminum-silicon carbide (AlSiC), in accordance with some embodiments.

Figure 9:
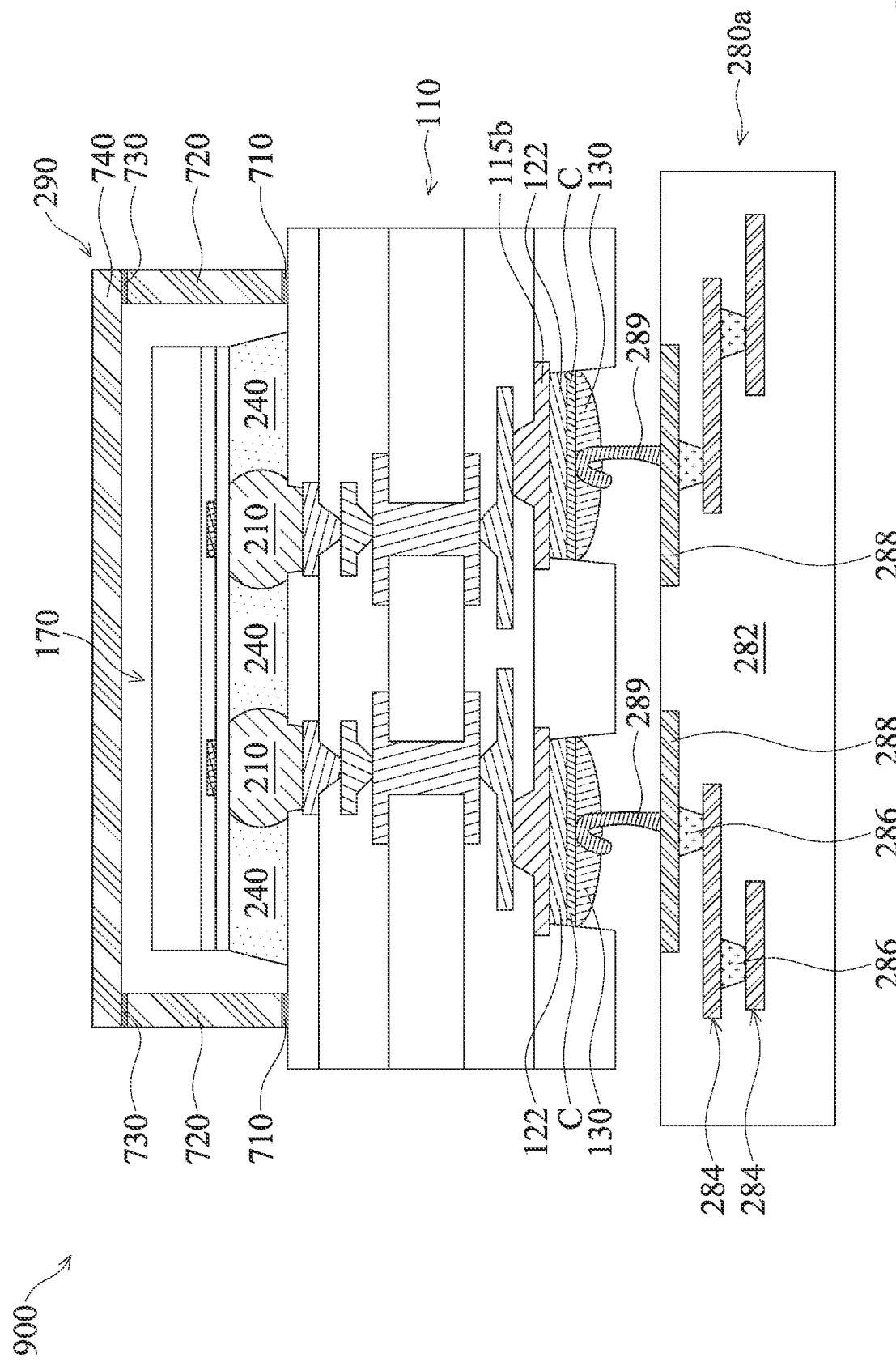
FIG. 9 is a cross-sectional view of a chip package structure, in accordance with some embodiments.

FIG. 9 is a cross-sectional view of a chip package structure 900, in accordance with some embodiments. As shown in FIG. 9, the chip package structure 900 is similar to the chip package structure 300 of FIG. 3, except that the chip package structure 900 further has an adhesive layer 710, a heat-spreading ring 720, an adhesive layer 730 and a heat-spreading plate 740, in accordance with some embodiments. The chip package structure 900 does not have the molding layer 250 of the chip package structure 300, in accordance with some embodiments.

The adhesive layer 710 is formed over the wiring substrate 110, in accordance with some embodiments. The adhesive layer 710 surrounds the chip 170 and the underfill layer 240, in accordance with some embodiments. The adhesive layer 710 has a ring shape, in accordance with some embodiments. The heat-spreading ring 720 is disposed over the adhesive layer 710, in accordance with some embodiments.

The adhesive layer 730 is formed over the heat-spreading ring 720, in accordance with some embodiments. The adhesive layer 730 has a ring shape, in accordance with some embodiments. The heat-spreading plate 740 is disposed over the adhesive layer 730 and the chip 170, in accordance with some embodiments.

The adhesive layers 710 and 730 are made of polymer, such as epoxy or silicone, in accordance with some embodiments. The adhesive layers 710 and 730 are formed using a dispensing process, in accordance with some embodiments.

The heat-spreading ring 720 and the heat-spreading plate 740 are made of a high thermal conductivity material, such as a metal material (aluminum or copper), an alloy material (e.g., stainless steel), or aluminum-silicon carbide (AlSiC), in accordance with some embodiments.

Processes and materials for forming the chip package structures 200, 300, 490, 520, 600, 700, 800 and 900 may be similar to, or the same as, those for forming the chip package structure 100 described above.

In accordance with some embodiments, chip package structures and methods for forming the same are provided. The methods (for forming the chip package structure) form a conductive protection layer over a nickel-containing layer over pads before deflux processes to protect the nickel-containing layer from being oxidized during deflux processes. Therefore, the adhesion between the pads and conductive bumps subsequently formed between the pads and a chip is improved. As a result, the yield of the chip package structure is improved.

In accordance with some embodiments, a chip package structure is provided. The chip package structure includes a first wiring substrate including a substrate, a first pad, a second pad, and an insulating layer. The first pad and the second pad are respectively over a first surface and a second surface of the substrate, the insulating layer is over the first surface and partially covers the first pad, and the first pad is wider than the second pad. The chip package structure includes a nickel-containing layer over the first pad. The chip package structure includes a conductive protection layer over the nickel-containing layer. The conductive protection layer includes tin, and a recess is surrounded by the conductive protection layer and the insulating layer over the first pad. The chip package structure includes a chip over the second surface of the substrate. The chip package structure includes a conductive bump between the second pad and the chip.

In accordance with some embodiments, a chip package structure is provided. The chip package structure includes a first wiring substrate including a substrate, a first pad, a second pad, and an insulating layer. The first pad and the second pad are respectively over a first surface and a second surface of the substrate, and the insulating layer partially covers the first pad. The chip package structure includes a conductive protection element covering the first pad, wherein a bottommost end of the conductive protection element is closer to the first pad than a bottommost surface of the insulating layer, and the conductive protection layer includes tin. The chip package structure includes a metal-containing layer between the first pad and the conductive protection element. The conductive protection element and the metal-containing layer are made of different materials. The chip package structure includes a chip bonded to the second pad.

In accordance with some embodiments, a chip package structure is provided. The chip package structure includes a first wiring substrate including a substrate, a first pad, a second pad, and an insulating layer. The first pad and the second pad are respectively over a first surface and a second surface of the substrate, and the insulating layer partially covers the first pad. The chip package structure includes a tin-containing protection element covering the first pad. The tin-containing protection element is thinner than the insulating layer. The chip package structure includes a metal-containing layer between the tin-containing protection element and the first pad. The chip package structure includes a chip bonded to the second pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A chip package structure, comprising:
   a first wiring substrate comprising a substrate, a first pad, a second pad, and an insulating layer, wherein the first pad and the second pad are respectively over a first surface and a second surface of the substrate, the insulating layer is over the first surface and partially covers the first pad, and the first pad is wider than the second pad;
   a nickel-containing layer over the first pad;
   a conductive protection layer over the nickel-containing layer, wherein the conductive protection layer comprises tin, and a recess is surrounded by the conductive protection layer and the insulating layer over the first pad;
   a chip over the second surface of the substrate; and
   a conductive bump between the second pad and the chip.
2. The chip package structure as claimed in claim 1, further comprising:
   a second wiring substrate, wherein the first wiring substrate is over the second wiring substrate, the second wiring substrate comprises a second substrate and a resilient contact structure mounted to the second substrate, and the resilient contact structure is in direct contact with the conductive protection layer.
3. The chip package structure as claimed in claim 2, wherein the resilient contact structure is a resilient metal strip.
4. The chip package structure as claimed in claim 2, wherein the resilient contact structure penetrates into the conductive protection layer.
5. The chip package structure as claimed in claim 4, wherein a portion of the conductive protection layer is between the resilient contact structure and the nickel-containing layer.
6. The chip package structure as claimed in claim 2, wherein a first portion of the resilient contact structure is in the recess, and a second portion of the resilient contact structure is outside of the recess.
7. The chip package structure as claimed in claim 1, further comprising:
   an intermetallic compound layer between the conductive protection layer and the nickel-containing layer, wherein the intermetallic compound layer comprises tin and nickel.
8. The chip package structure as claimed in claim 1, wherein a first sidewall of the substrate is vertically aligned with a second sidewall of the insulating layer.
9. The chip package structure as claimed in claim 1, wherein the insulating layer is thicker than the conductive protection layer.
10. The chip package structure as claimed in claim 1, wherein opposite edges of the nickel-containing layer are in direct contact with the insulating layer.
11. A chip package structure, comprising:
    a first wiring substrate comprising a substrate, a first pad, a second pad, and an insulating layer, wherein the first pad and the second pad are respectively over a first surface and a second surface of the substrate, and the insulating layer partially covers the first pad;
    a conductive protection element covering the first pad, wherein a bottommost end of the conductive protection element is closer to the first pad than a bottommost surface of the insulating layer, and the conductive protection layer comprises tin;
    a metal-containing layer between the first pad and the conductive protection element, wherein the conductive protection element and the metal-containing layer are made of different materials;
    a chip bonded to the second pad; and
    a second wiring substrate, wherein the first wiring substrate is over the second wiring substrate, the second wiring substrate comprises a second substrate and a resilient contact structure mounted to the second substrate, and the resilient contact structure is electrically connected to the conductive protection element.
12. The chip package structure as claimed in claim 11, wherein a first sidewall of the conductive protection element is aligned with a second sidewall of the metal-containing layer.
13. The chip package structure as claimed in claim 11, wherein a first sidewall of the first wiring substrate and a second sidewall of the insulating layer are vertically aligned with each other.
14. The chip package structure as claimed in claim 11, wherein the resilient contact structure is closer to the first pad than the bottommost surface of the insulating layer.
15. The chip package structure as claimed in claim 11, wherein the resilient contact structure extends into the insulating layer.

16. The chip package structure as claimed in claim 11, wherein the resilient contact structure extends into the conductive protection element.

17. The chip package structure as claimed in claim 11, wherein the resilient contact structure has a J-shape in a cross-sectional view of the second wiring substrate.

18. A chip package structure, comprising:
- a first wiring substrate comprising a substrate, a first pad, a second pad, and an insulating layer, wherein the first pad and the second pad are respectively over a first surface and a second surface of the substrate, and the insulating layer partially covers the first pad;
- a tin-containing protection element covering the first pad, wherein the tin-containing protection element is thinner than the insulating layer;
- a metal-containing layer between the tin-containing protection element and the first pad;
- a chip bonded to the second pad; and
- a second wiring substrate, wherein the first wiring substrate is over the second wiring substrate, the second wiring substrate comprises a second substrate and a contact structure mounted to the second substrate, the contact structure is electrically connected to the tin-containing protection element, and the contact structure penetrates into the tin-containing protection element.

19. The chip package structure as claimed in claim 18, wherein the tin-containing protection element is wider than the contact structure.

20. The chip package structure as claimed in claim 18, wherein the contact structure is closer to the first pad than a bottommost surface of the insulating layer.

* * * * *